US009172021B2

(12) United States Patent
Sugizaki et al.

(10) Patent No.: US 9,172,021 B2
(45) Date of Patent: Oct. 27, 2015

(54) SEMICONDUCTOR LIGHT EMITTING DEVICE

(71) Applicant: KABUSHIKI KAISHA TOSHIBA, Minato-ku, Tokyo (JP)

(72) Inventors: Yoshiaki Sugizaki, Kanagawa-ken (JP); Hideyuki Tomizawa, Kanagawa-ken (JP); Akihiro Kojima, Kanagawa-ken (JP); Hideto Furuyama, Kanagawa-ken (JP); Miyoko Shimada, Kanagawa-ken (JP); Yosuke Akimoto, Kanagawa-ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/595,869

(22) Filed: Jan. 13, 2015

(65) Prior Publication Data
US 2015/0123159 A1 May 7, 2015

Related U.S. Application Data

(62) Division of application No. 13/784,770, filed on Mar. 4, 2013, now Pat. No. 8,957,444.

(30) Foreign Application Priority Data

May 28, 2012 (JP) ................................ 2012-121333

(51) Int. Cl.
*H01L 33/62* (2010.01)
*H01L 33/36* (2010.01)
(Continued)

(52) U.S. Cl.
CPC .............. *H01L 33/62* (2013.01); *H01L 25/167* (2013.01); *H01L 33/36* (2013.01); *H01L 33/50* (2013.01); *H01L 2924/0002* (2013.01)

(58) Field of Classification Search
CPC ................. H01L 2924/00; H01L 2924/00014; H01L 33/38; H01L 33/486; H01L 2924/01029; H01L 33/44; H01L 33/62
USPC ..................................................... 257/98–99
See application file for complete search history.

(56) References Cited

U.S. PATENT DOCUMENTS

| 8,110,421 B2 | 2/2012 | Sugizaki et al. |
| 2002/0139987 A1 | 10/2002 | Collins, III et al. |

(Continued)

FOREIGN PATENT DOCUMENTS

| JP | 2002359402 A | 12/2002 |
| JP | 2011114161 A | 6/2011 |

(Continued)

OTHER PUBLICATIONS

Taiwanese Office Action dated Jan. 27, 2015 (and English translation thereof), issued in counterpart Taiwanese Application No. 102104578.

(Continued)

*Primary Examiner* — David Vu
*Assistant Examiner* — Jonathan Han
(74) *Attorney, Agent, or Firm* — Holtz, Holtz, Goodman & Chick PC

(57) ABSTRACT

According to an embodiment, a semiconductor light emitting device includes a semiconductor layer, a first electrode, an second electrode, a first insulating film, a first interconnection and a second interconnection. The semiconductor layer includes a luminous portion and a non-luminous portion. The first electrode is provided on the luminous portion, and the second electrode is provided on the non-luminous portion. The first insulating film is provided on the semiconductor layer, the first electrode and the second electrode. The first interconnection having a first protrusion is provided on the first insulating film and electrically connected to the first electrode. The second interconnection having a second protrusion is provided on the first insulating film and electrically connected to the second electrode. A tip end of the first protrusion faces a tip end of a second protrusion, being apart therefrom with a minimum gap between the first interconnection and the second interconnection.

14 Claims, 23 Drawing Sheets

(51) Int. Cl.
*H01L 25/16* (2006.01)
*H01L 33/50* (2010.01)

(56) References Cited

U.S. PATENT DOCUMENTS

| | | |
|---|---|---|
| 2003/0127747 A1 | 7/2003 | Kajiwara et al. |
| 2004/0195579 A1* | 10/2004 | Sonobe ............ 257/99 |
| 2006/0151802 A1 | 7/2006 | Tsuchiya et al. |
| 2006/0163604 A1* | 7/2006 | Shin et al. ........ 257/103 |
| 2007/0023777 A1 | 2/2007 | Sonobe et al. |
| 2010/0148198 A1* | 6/2010 | Sugizaki et al. ...... 257/98 |
| 2011/0220910 A1 | 9/2011 | Kojima et al. |
| 2011/0233587 A1 | 9/2011 | Unno |
| 2011/0253430 A1 | 10/2011 | Woychik et al. |
| 2011/0260184 A1 | 10/2011 | Furuyama |
| 2011/0284909 A1* | 11/2011 | Sugizaki ............ 257/99 |
| 2011/0291148 A1 | 12/2011 | Sugizaki et al. |
| 2011/0297998 A1 | 12/2011 | Akimoto et al. |
| 2013/0234154 A1 | 9/2013 | Kojima et al. |

FOREIGN PATENT DOCUMENTS

| | | |
|---|---|---|
| JP | 2011155315 A | 8/2011 |
| JP | 2011187679 A | 9/2011 |
| JP | 2011199221 A | 10/2011 |
| JP | 2011233650 A | 11/2011 |
| JP | 2011251807 A | 12/2011 |
| JP | 2011253924 A | 12/2011 |
| TW | 200842908 A | 11/2008 |
| TW | 201143169 A | 12/2011 |
| TW | 201203630 A | 1/2012 |
| TW | 201218564 A | 5/2012 |

OTHER PUBLICATIONS

Japanese Office Action (and English translation thereof) dated Jun. 2, 2015, issued in counterpart Japanese Application No. 2012-121333.

* cited by examiner

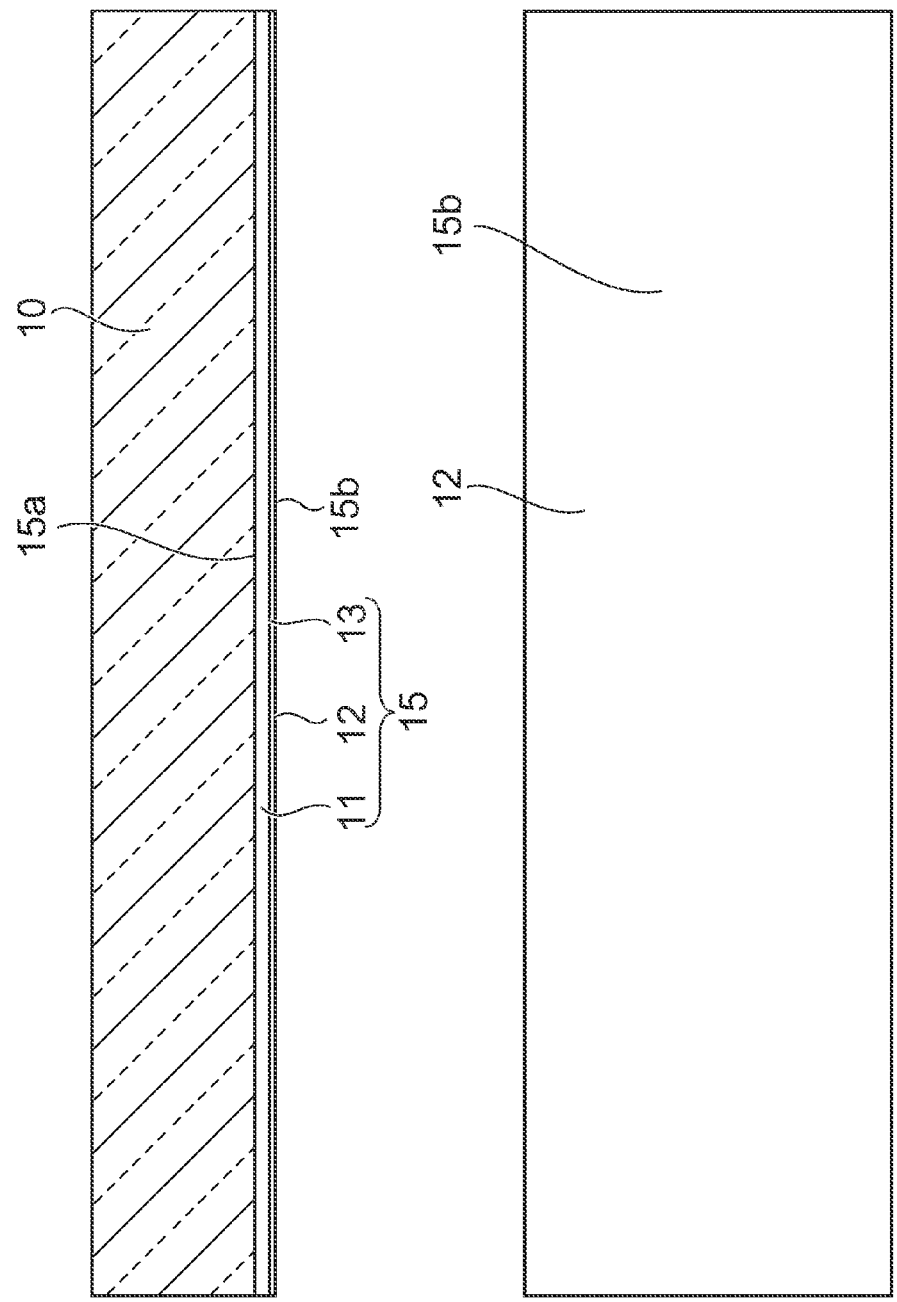

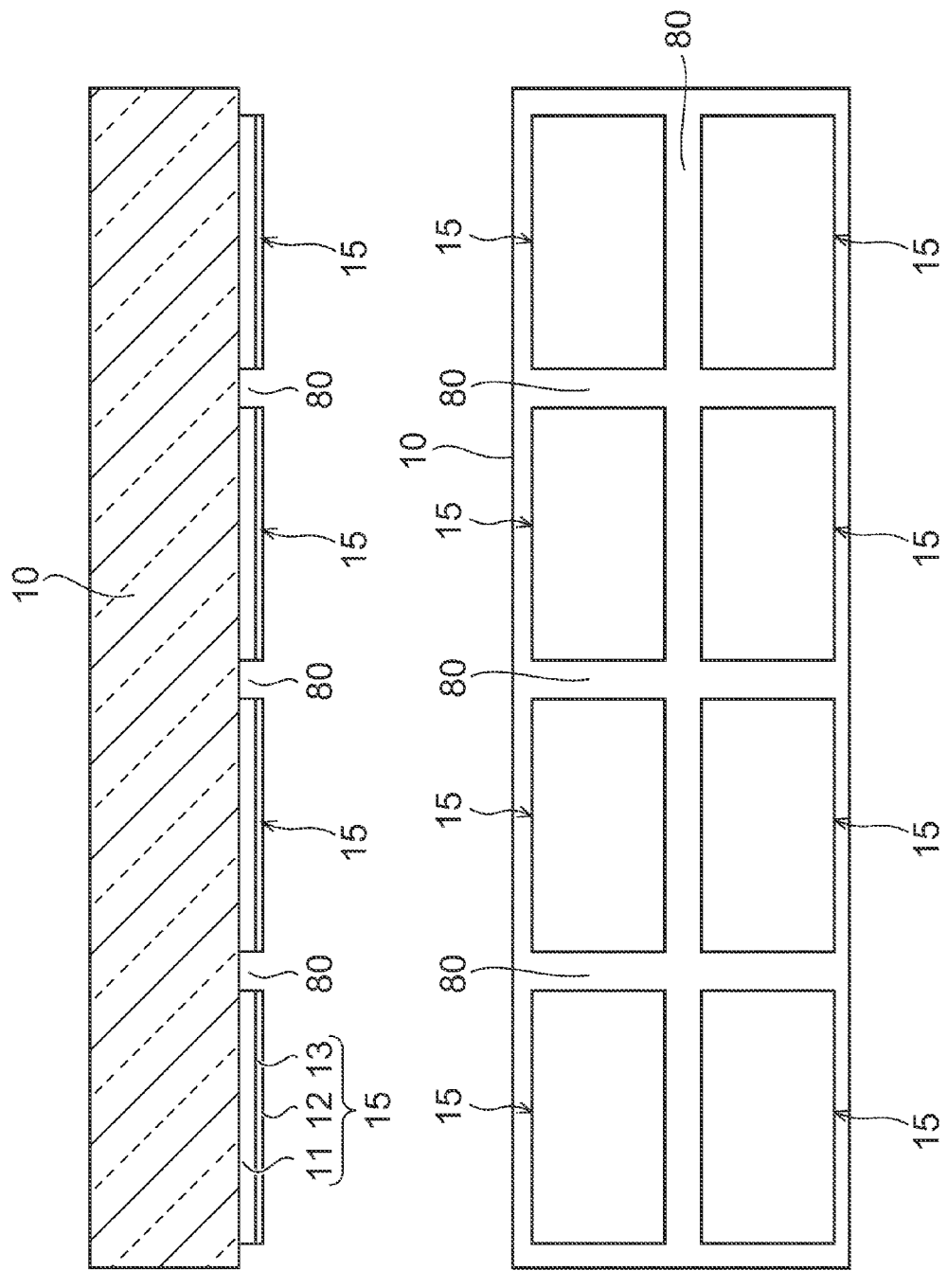

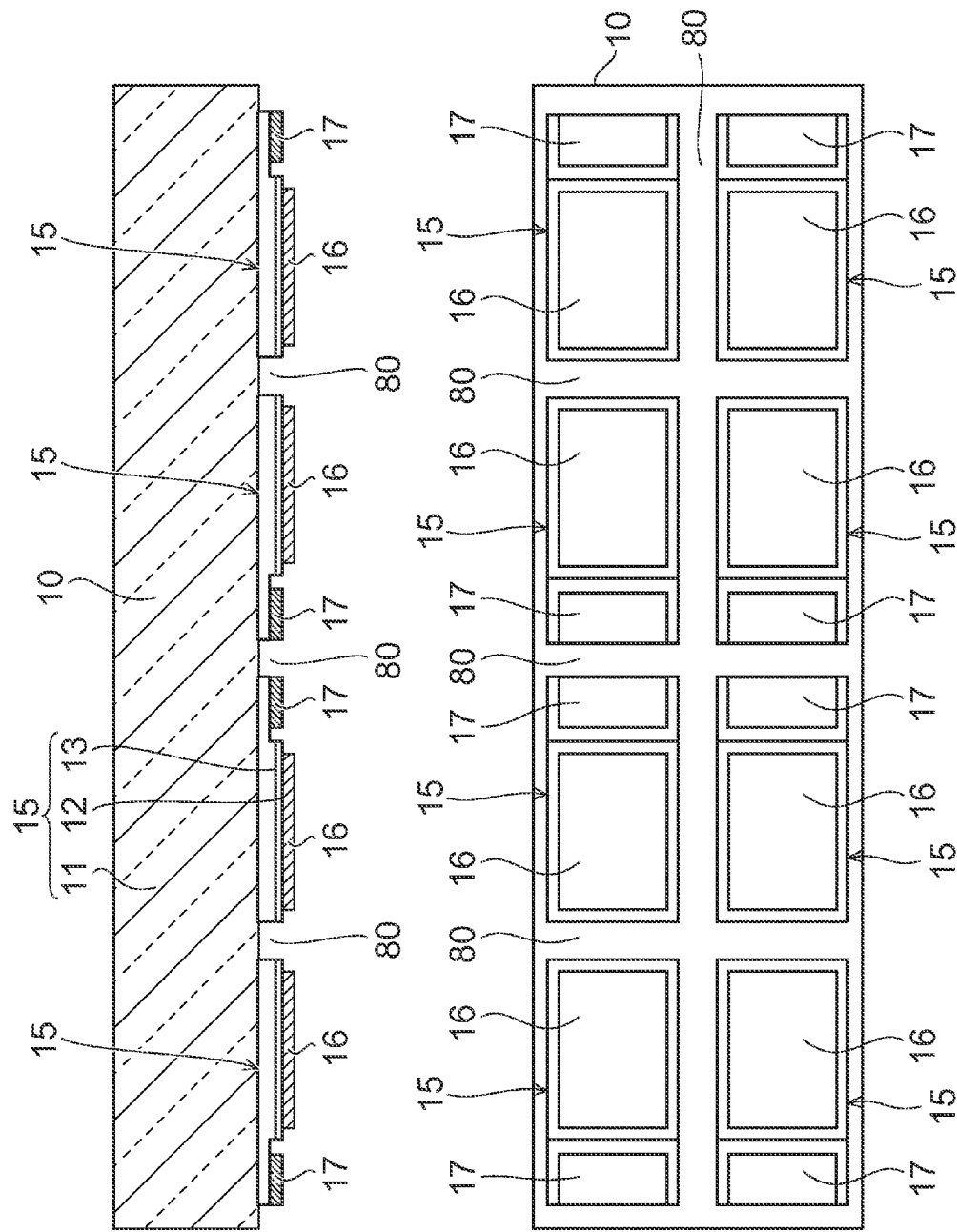

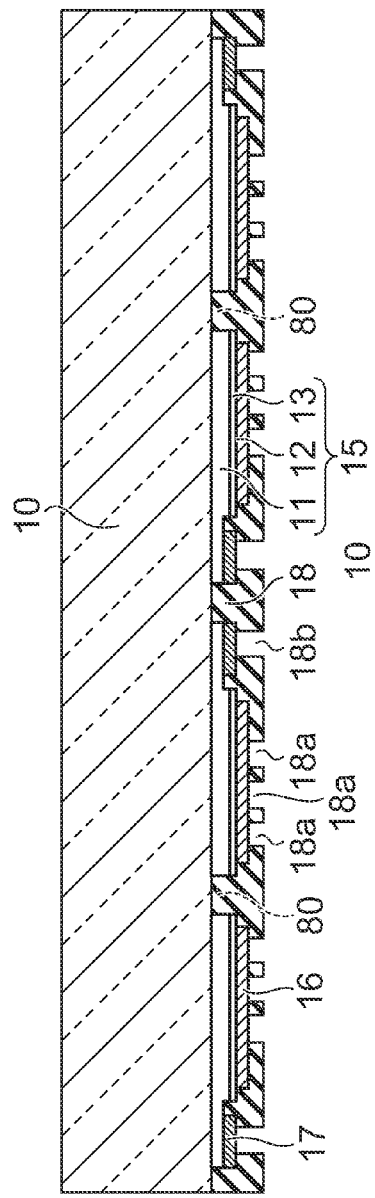
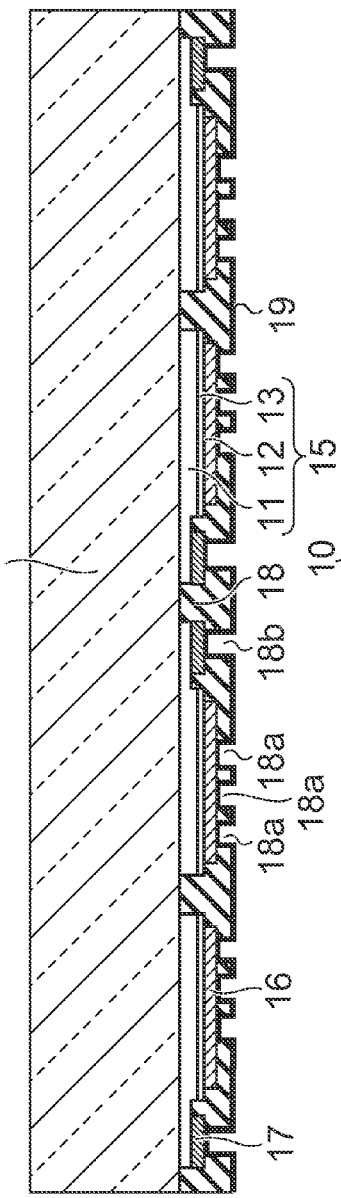
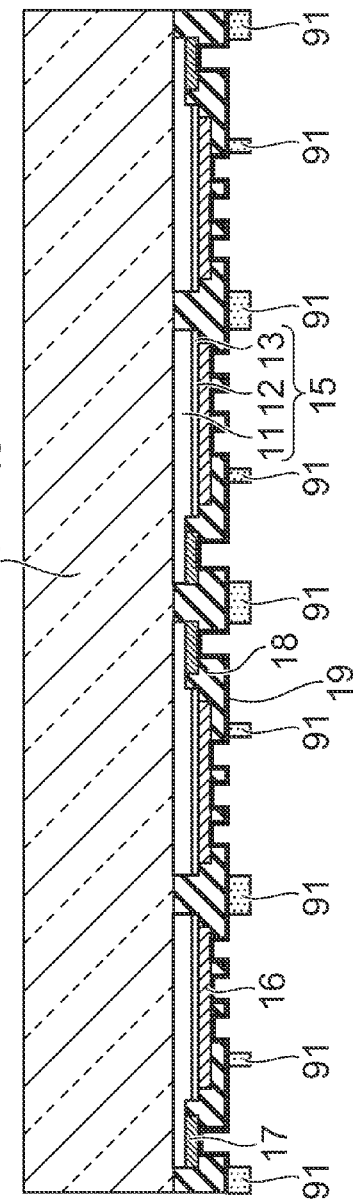
FIG. 6A
FIG. 6B
FIG. 6C

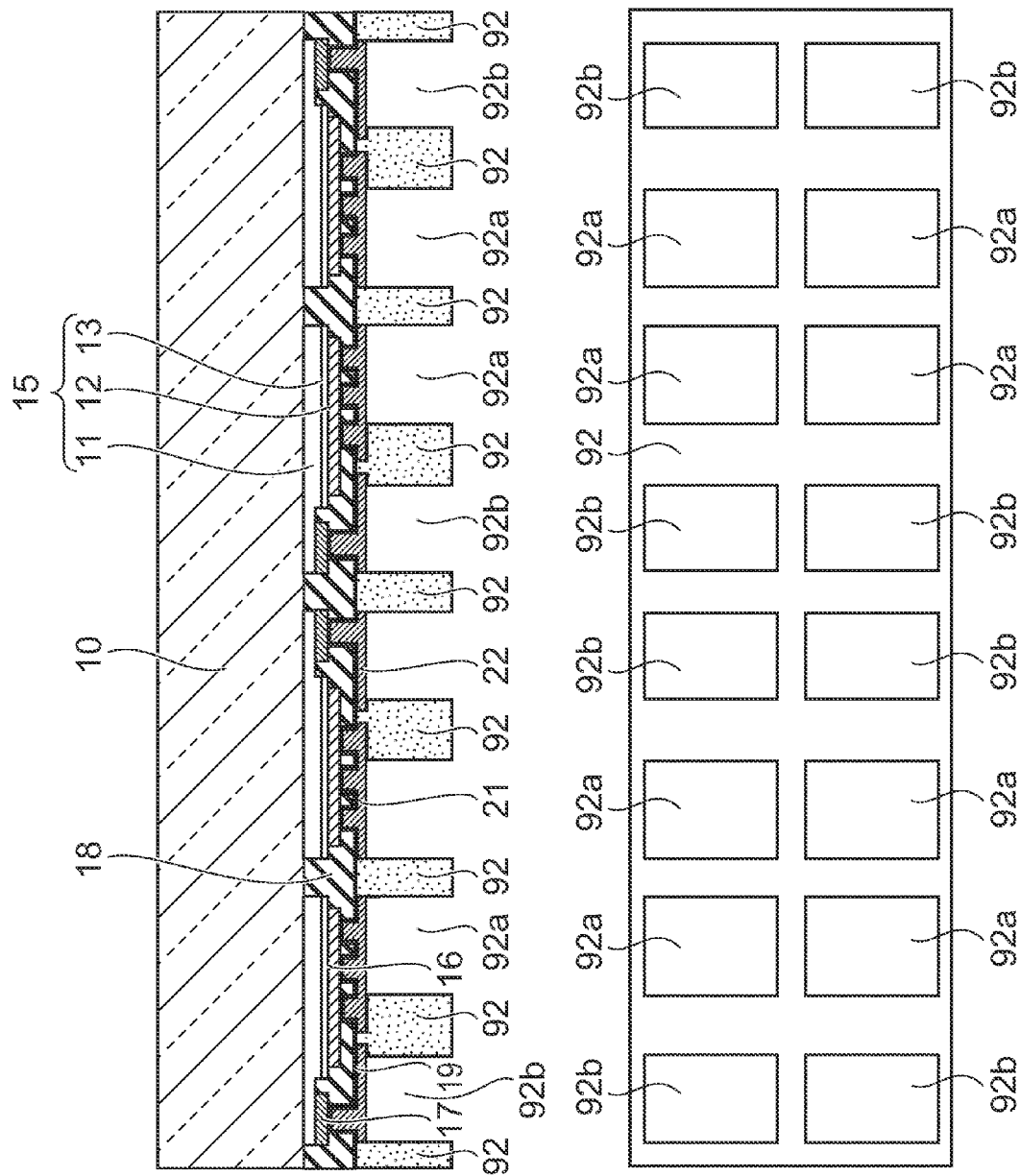

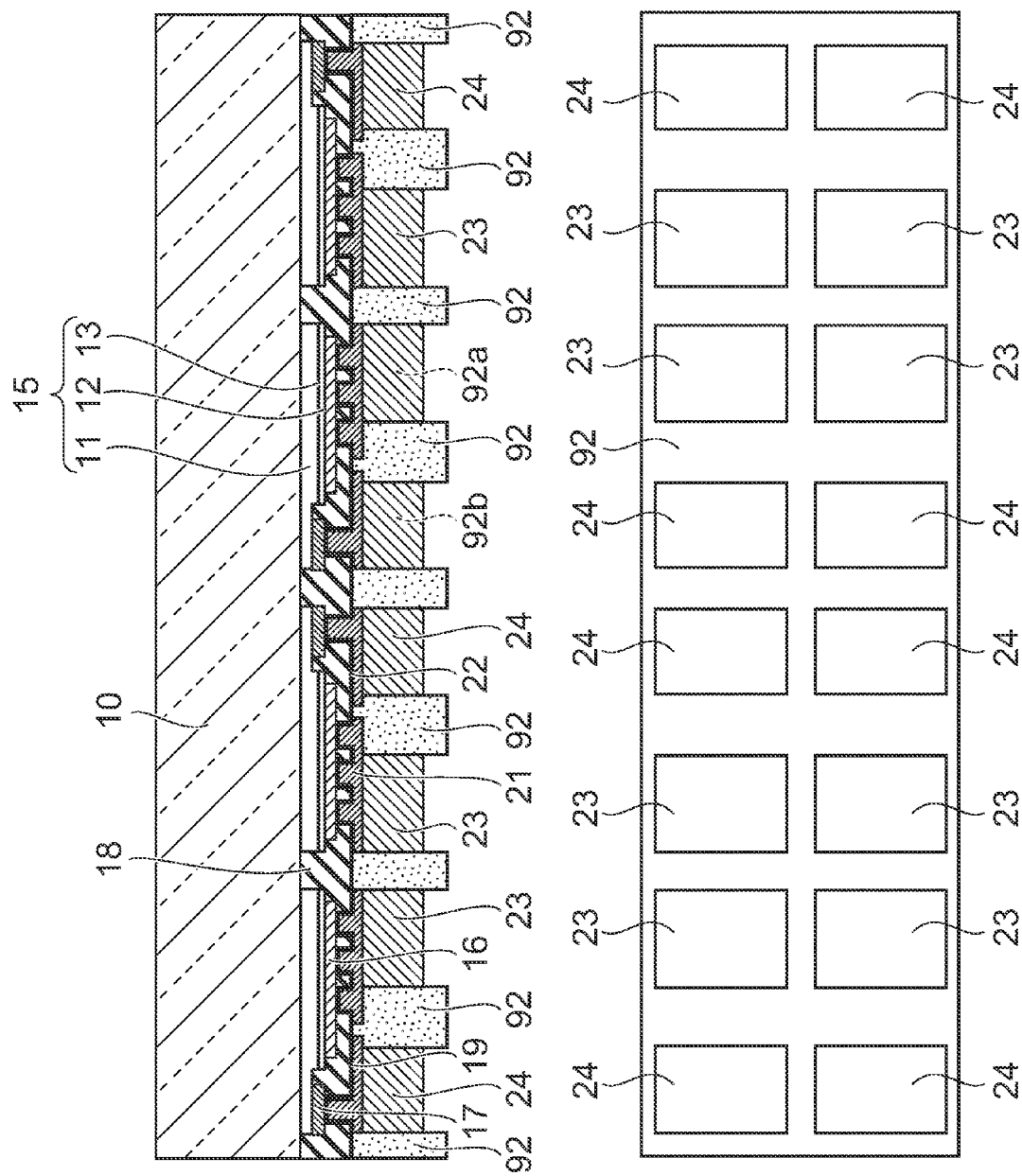

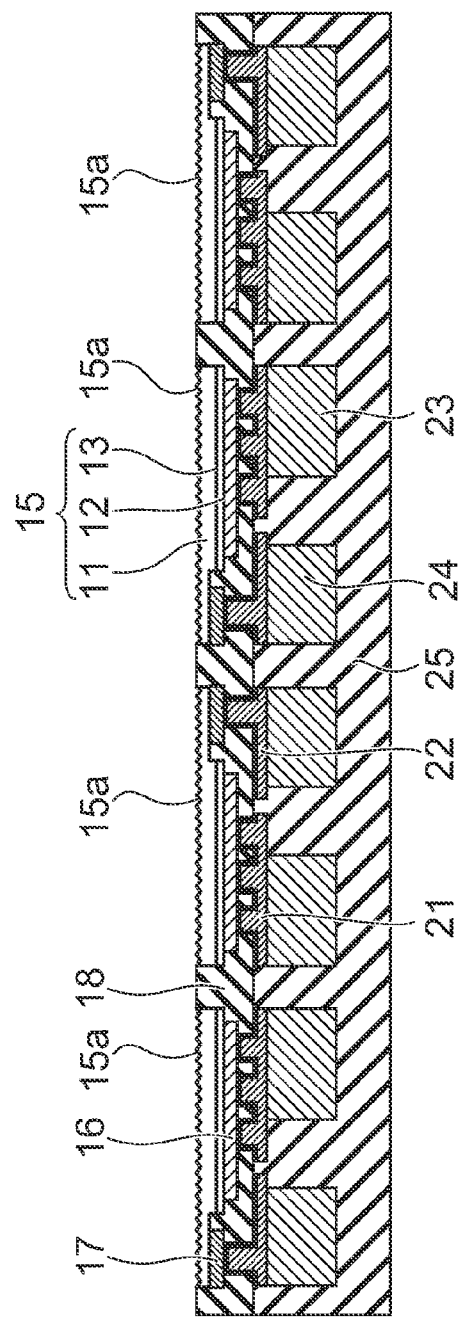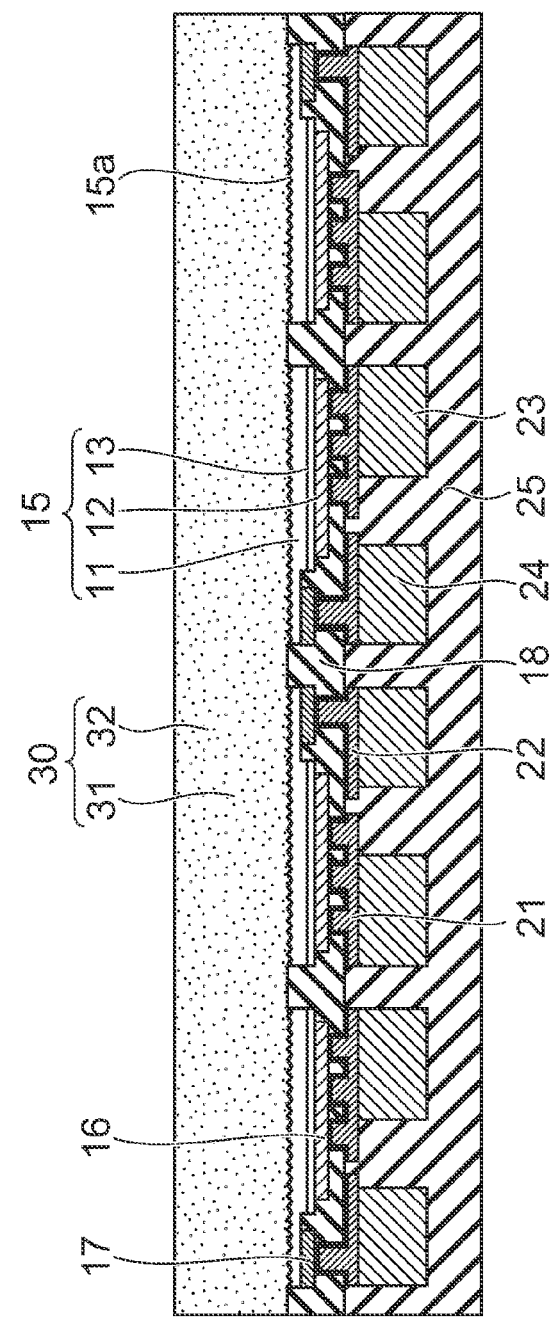

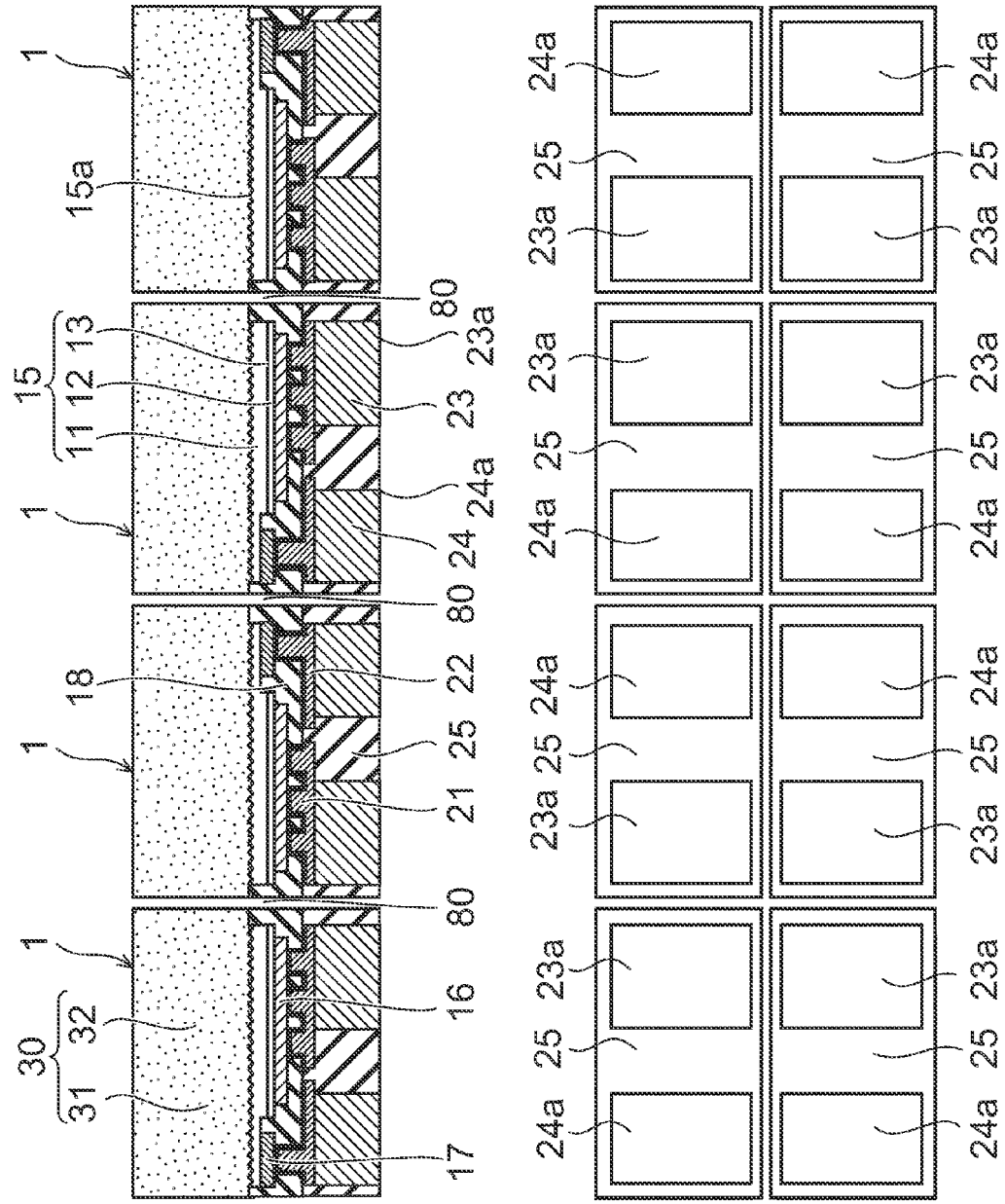

SEMICONDUCTOR LIGHT EMITTING DEVICE

CROSS-REFERENCE TO RELATED APPLICATIONS

This application is a Divisional application of U.S. application Ser. No. 13/784,770, filed on Mar. 4, 2013, which is based upon and claims the benefit of priority from Japanese Patent Application No. 2012-121333, filed on May 28, 2012. The entire contents of both of the above-identified applications are incorporated herein by reference.

FIELD

Embodiments are related generally to a semiconductor light emitting device.

BACKGROUND

A semiconductor light emitting device, which combines a semiconductor light emitting element with a phosphor, is going to be widely used in many applications as a light source that emits visible light such as white light or emits light in other wavebands, since it may be easily downsized and easily handled. For example, accommodating a semiconductor light emitting layer separated from a substrate in a resin package may implement a chip-size and low profiled light emitting device. However, it is difficult to build an ESD (Electro-Static Discharge) protection element, for example, in the chip size packages.

BRIEF DESCRIPTION OF THE DRAWINGS

FIGS. 2A to 13B are schematic views illustrating a manufacturing process of the semiconductor light emitting device according to the first embodiment;

DETAILED DESCRIPTION

Figure 1A:
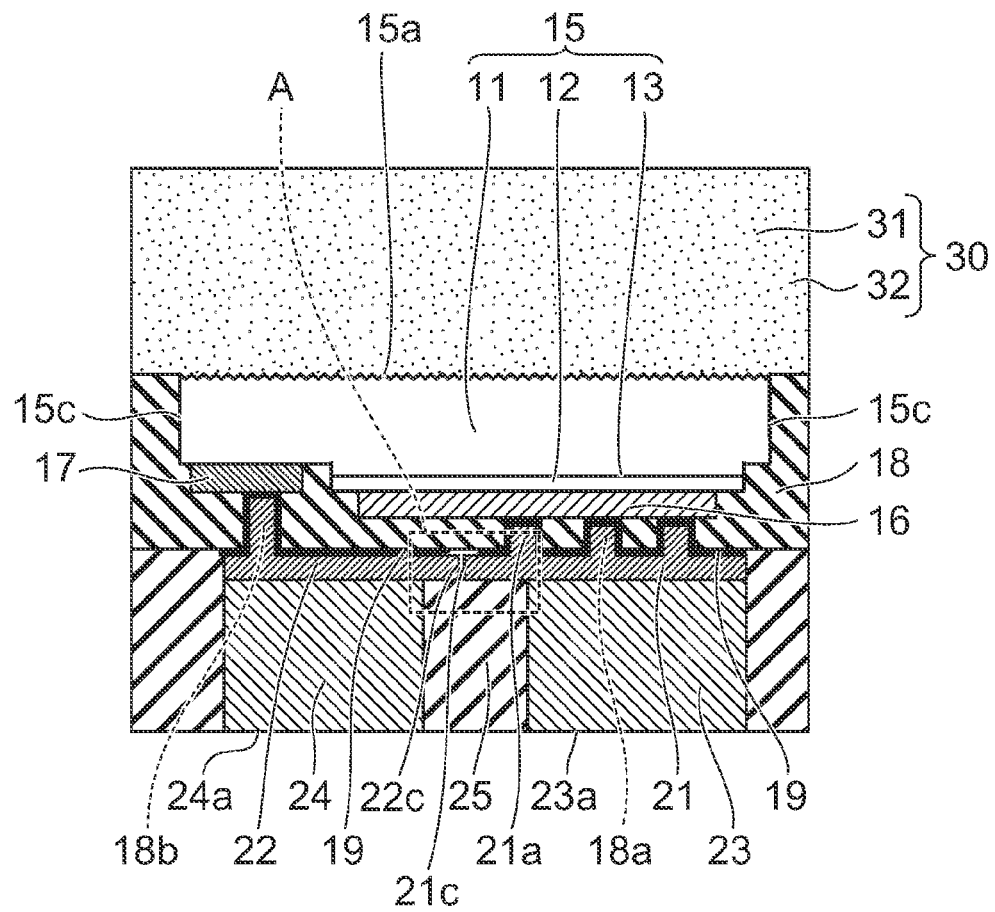
FIGS. 1A and 1B are schematic views illustrating a semiconductor light emitting device according to a first embodiment.

According to an embodiment, a semiconductor light emitting device includes a semiconductor layer, a first electrode and an second electrode. The semiconductor layer has a first face and a second face opposite to the first face, and includes a luminous portion and a non-luminous portion. The first electrode is provided on the luminous portion on the second face side, and the second electrode is provided on the non-luminous portion on the second face side. The device also includes a first insulating film, a first interconnection and a second interconnection. The first insulating film is provided on the semiconductor layer, the first electrode and the second electrode. The first interconnection is provided on the first insulating film and electrically connected to the first electrode. The second interconnection apart from the first interconnection is provided on the first insulating film and electrically connected the second electrode. The first interconnection has a first protrusion extending in a direction parallel to the second face, and the second interconnection has a second protrusion extending toward the first interconnection. A tip end of the first protrusion faces a tip end of the second protrusion, being apart from the tip end of the second portion with a minimum gap between the first interconnection and the second interconnection.

Embodiments will be described with reference to the drawings. Like reference numerals in the drawings denote like elements, and the descriptions of the like elements are appropriately omitted and the different elements are described.

In the following description, the first electrode, the first interconnection layer, the first metal pillar and the first interconnection are explained respectively as a p-side electrode, a p-side interconnection layer, a p-side pillar and a p-side interconnection. The second electrode, the second interconnection layer, the second metal pillar and the second interconnection are explained respectively as a n-side electrode, a n-side interconnection layer, a n-side pillar and a n-side interconnection. It may also be possible to change the type of conductivity, such that the n-side electrode serves as the first electrode, and the p-side electrode serves as the second electrode.

First Embodiment

FIG. 1A is a schematic cross-sectional view of a semiconductor light emitting device 1 according to a first embodiment. The semiconductor light emitting device 1 includes a semiconductor layer 15 having a light emitting layer 13. The semiconductor layer 15 includes a first face 15a and a second face 15b opposite to the first face 15a (see FIG. 2A), and electrodes and interconnections are provided on the second face side. The semiconductor layer 15 emits light outward from the light emitting layer 13 through the first face 15a.

The semiconductor layer 15 includes a first semiconductor layer 11 and a second semiconductor layer 12. The first semiconductor layer 11 and the second semiconductor layer 12, for example, contain gallium nitride. The first semiconductor layer 11 may include an underlying buffer layer, an n-type GaN layer, and the like. The second semiconductor layer 12 includes a p-type GaN layer, a light emitting layer (active layer) 13, and the like. The light emitting layer 13 may include a material that emits blue light, purple light, blue-purple light, ultraviolet light, or the like.

The semiconductor layer 15 has a luminous portion and a non-luminous portion. For instance, the luminous portion includes the light emitting layer 13, and the non-luminous portion does not includes the light emitting layer 13.

Namely, the semiconductor layer 15 is processed in a concavity and convexity shape on the second face side. The convexity portion includes the light emitting layer 13, and a p-side electrode 16 is provided on the surface of the second semiconductor layer 12, which is the surface of the convexity portion. In other words, the p-side electrode 16 is provided on the luminous portion including the light emitting layer 13 on the second face side.

On the second face side of the semiconductor layer 15, the non-luminous portion not including the light emitting layer 13 is provided side by side with the convexity portion. An n-side electrode 17 is provided on the non-luminous portion not including the light emitting layer 13, which is part of the first semiconductor layer 11. An area of the luminous portion on the second face side is provided wider than an area of the non-luminous on the second face side.

A first insulating film (hereinafter, simply referred to as an insulating film 18) is provided on the second face side of the semiconductor layer 15. The insulating film 18 covers the semiconductor layer 15, the p-side electrode 16, and the n-side electrode 17. In addition, the insulating film 18 covers the side surfaces of the light emitting layer 13 and the second semiconductor layer 12 for protection.

In addition, another insulating film (for example, a silicon oxide film) may be provided between the insulating film 18 and the semiconductor layer 15. The insulating film 18, for example, is formed of a resin such as polyimide that is superior for the patterning of fine openings. Alternatively, an inorganic film such as a silicon oxide film or a silicon nitride film may be used as the material of the insulating film 18. The insulating film 18 covers the semiconductor layer 15 except for the first surface 15a. The insulating film 18 covers a side face 15c contacting the first face 15a at a corner, and not provided on the first face 15a.

A p-side interconnection layer 21 and an n-side interconnection layer 22 are provided on a face of the insulating film 18 opposite to the second face of the semiconductor layer 15, so as to be separated from each other.

Parts of the p-side interconnection layer 21 are provided in a plurality of first openings 18a that are formed in the insulating film 18 up to the p-side electrodes 16, and the p-side interconnection layer 21 is electrically connected to the p-side electrodes 16. A part of the n-side interconnection layer 22 is also provided in a second opening 18b that is formed in the insulating film 18 up to the n-side electrodes 17, and the n-side interconnection layer 22 is electrically connected to the n-side electrodes 17.

A p-side metal pillar 23 is provided on a face of the p-side interconnection layer 21 opposite to the p-side electrode 16. Then, a p-side interconnection according to the embodiment includes the p-side interconnection layer 21, the p-side metal pillar 23, and a metal film 19 that serves as a seed layer to be described later.

An n-side metal pillar 24 is provided on a face of the n-side interconnection layer 22 opposite to the n-side electrodes 17. Then, an n-side interconnection includes the n-side interconnection layer 22, the n-side metal pillar 24, and the metal film 19 that is used as the seed layer.

A insulating film 25 serving as a second insulating film is stacked on the insulating film 18. The insulating film 25 covers the periphery of the p-side interconnection and the periphery of the n-side interconnection. In addition, the insulating film 25 is filled up between the p-side metal pillar 23 and the n-side metal pillar 24. The side surfaces of the p-side metal pillar 23 and the n-side metal pillar 24 are covered with the insulating film 25.

A face of the p-side metal pillar 23 opposite to the p-side interconnection layer 21 is exposed from the insulating film 25 and serves as a p-side external terminal 23a. A face of the n-side metal pillar 24 opposite to the n-side interconnection layer 22 is exposed from the insulating film 25 and serves as an n-side external terminal 24a. The p-side external terminal 23a and the n-side external terminal 24a are bonded to a pad formed in a mounting substrate through a bonding member such as a solder, other metal, a material having conductivity, or the like.

The p-side external terminal 23a and the n-side external terminal 24a are exposed on the same face of the insulating film 25 (on the lower surface in FIG. 1A).

A distance between the p-side external terminal 23a and the n-side external terminal 24a is longer than a distance between the p-side interconnection layer 21 and the n-side interconnection layer 22 on the insulating film 18. The p-side external terminal 23a and the n-side external terminal 24a are separated from each other with such a distance, so that the external terminals do not form a short circuit via solder or the like at the time of being mounted on the mounting substrate.

On the other hand, the p-side interconnection layer 21 may approach the n-side interconnection layer 22 up to a process limit, and accordingly, the area of the p-side interconnection layer 21 may be widened. Thereby, the contact area can be enlarged between the p-side interconnection layer 21 and the p-side electrode 16. It becomes possible to reduce a current density in the p-side interconnection, and to improve the heat dissipation.

Furthermore, the area of the p-side interconnection layer 21 that is in contact with the p-side electrodes 16 through the plurality of first openings 18a is possible to be larger than the area of the n-side interconnection layer 22 that is in contact with the n-side electrodes 17 through the second openings 18b. Thereby, the current injected into the light emitting layer can be reduced, and the current distribution in the light emitting layer 13 becomes uniform. In addition, the heat dissipation from the light emitting layer 13 through the p-side interconnection can be improved.

A high optical output can be acquired, since the light emitting layer 13 is formed over the first region that is larger than the second region on which the n-side electrode 17 is provided. In addition, the n-side interconnection layer 22 having a larger area than the n-side electrode 17 can be provided on the mounting face side. In the n-side interconnection layer 22, the portion extending on the insulating film 18 can be formed to have larger area than the contact portion that is in contact with the n-side electrodes 17.

The first semiconductor layer 11 is electrically connected to the n-side metal pillar 24 having the n-side external terminal 24a through the n-side electrode 17, the metal film 19, and the n-side interconnection layer 22. The second semiconductor layer 12 including the light emitting layer 13 is electrically connected to the p-side metal pillar 23 having the p-side external terminal 23a through the p-side electrode 16, the metal film 19, and the p-side interconnection layer 21.

The p-side metal pillar 23 is thicker than the p-side interconnection layer 21, and the n-side metal pillar 24 is thicker than the n-side interconnection layer 22. Each thickness of the p-side metal pillar 23, the n-side metal pillar 24, and the insulating film 25 is larger than that of the semiconductor layer 15. Here, the "thickness" represents a thickness in the vertical direction in FIG. 1.

In addition, each thickness of the p-side metal pillar 23 and the n-side metal pillar 24 is larger than that of a stacked body that includes the semiconductor layer 15, the p-side electrode 16, the n-side electrode 17, and the insulating film 18. In addition, the aspect ratio (the ratio of the thickness to the planar size) of each one of the metal pillars 23 and 24 is not limited to be one or more, and the ratio may be less than one. In other words, each thickness of the metal pillars 23 and 24 may be smaller than the planar size of the metal pillars 23 and 24.

Copper, gold, nickel, silver, and the like can be used as the materials of the p-side interconnection layer 21, the n-side interconnection layer 22, the p-side metal pillar 23, and the n-side metal pillar 24. Among these materials, copper is superior to the other material in thermal conductivity, resistance for migration, and adhesiveness to an insulating material.

In addition, when the semiconductor light emitting device 100 is mounted on the mounting substrate through the p-side external terminal 23a and the n-side external terminal 24a, the stress applied to the semiconductor layer 15 through soldering or the like can be absorbed and relieved by the p-side metal pillar 23 and the n-side metal pillar 24.

The p-side interconnection that includes the p-side interconnection layer 21 and the p-side metal pillar 23 is connected to the p-side electrode 16 through a plurality of vias 21a that are provided inside the plurality of first openings 18a and are separated from each other. Accordingly, an effective stress relieving can be obtained through the p-side interconnection.

Alternatively, the p-side interconnection layer 21 may be connected to the p-side electrode 16 through a post that has a planar size larger than the via 21a. In such a case, the heat dissipation of the light emitting layer 13 can be improved through the p-side electrode 16, the p-side interconnection layer 21, and the p-side metal pillar 23, all of which are formed of metal.

The insulating film 25 reinforces the p-side metal pillar 23 and the n-side metal pillar 24. It is preferable that the thermal expansion coefficient of the insulating film 25 is the same as or close to the thermal expansion coefficient of the mounting substrate. As examples of such a insulating film 25, there are an epoxy resin, a silicone resin, a fluorine resin, and the like.

On the other hand, a fine concavo-convex is formed on the first face 15a of the semiconductor layer 15 using wet etching (frost process), where an alkali-based solution is applied to the first face 15a. The light emitted from the light emitting layer 13 can be extracted outward through the first face 15a, suppressing light reflection at various incident angles by providing the concavo-convex on the first face 15a.

A phosphor layer 30 is provided on the side of the first face 15a. An intermediate layer, such as a buffer layer or an adhesive layer may be provided between the semiconductor layer 15 and the phosphor layer 30.

The phosphor layer 30 includes a transparent resin 31 and a plurality of phosphor particles 32 dispersed in the transparent resin 31. The transparent resin 31 has transparency for the lights emitted from the light emitting layer 13 and the phosphor 32. For example, a silicone resin, an acrylic resin, a phenyl resin, or the like may be used as the transparent resin 31.

The phosphor 32 absorbs light (pumping light) emitted from the light emitting layer 13, and emits wavelength converted light. The semiconductor light emitting device 1 emits the mixed light of the light emitted from the light emitting layer 13 and the wavelength converted light emitted from the phosphor 32.

When the phosphor 32 is a yellow phosphor that emits yellow light, the mixed light of white color or warm white color, for example, can be obtained, since the light emitting layer 13, which includes a GaN material, emits blue light, and the phosphor 32 emits the wavelength converted yellow light. It is noted that the phosphor layer 30 may include a plurality of types of phosphor (a red phosphor to emit red light and a green phosphor to emit green light, for example).

Figure 11A:
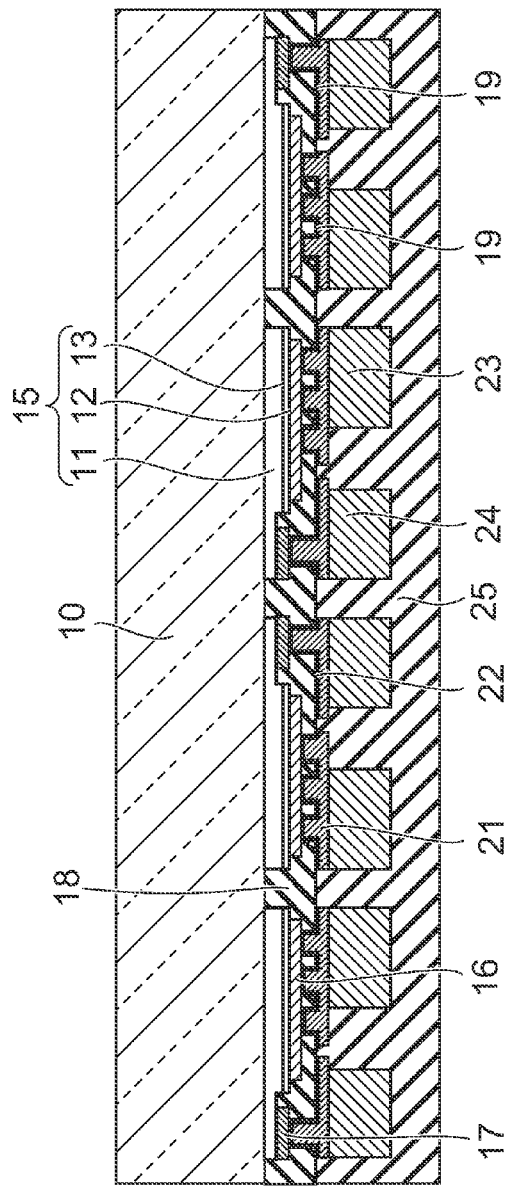
Figure 11B:
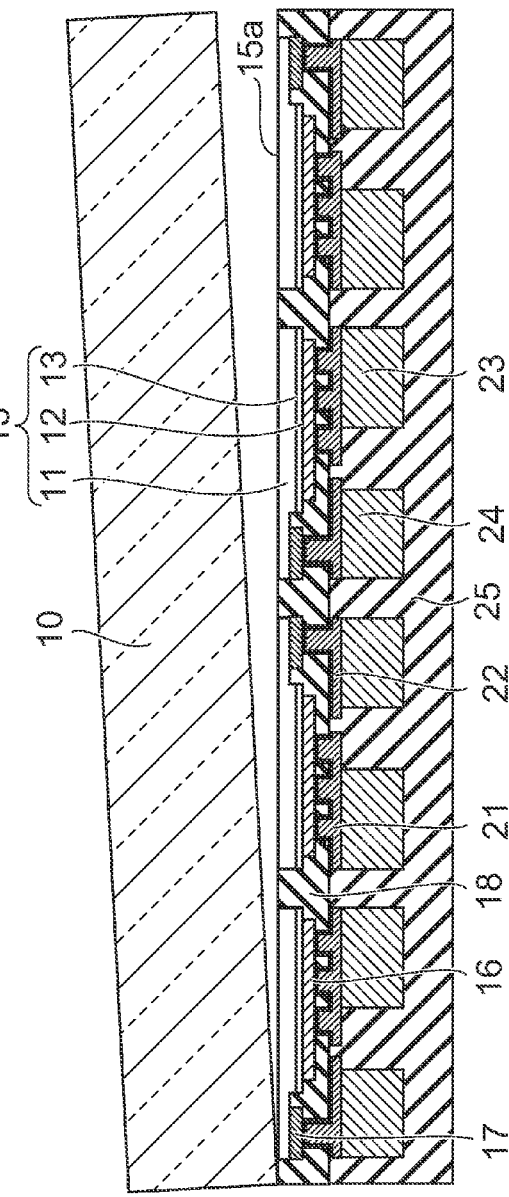

In the manufacturing processes of the semiconductor light emitting device 1 according to the embodiment, the substrate 10 used for forming the semiconductor layer 15 is removed (see FIG. 11B). The semiconductor layer 15 removed of the substrate 10 is stably supported by the p-side metal pillar 23, the n-side metal pillar 24, and the insulating film 25, enhancing the mechanical strength of the semiconductor light emitting device 1.

Strong internal stress is contained between the substrate 10 and the semiconductor layer 15 during the epitaxial growth, and released at once by removing the substrate 10. According to the embodiment, the insulating film 25, and the metal that configures the p-side metal pillar 23 and the n-side metal pillar 24 are more flexible than the material of the semiconductor layer 15. That is, the semiconductor layer 15 is supported by the flexible support members. Accordingly, the released stress may be absorbed by the insulating film 25, the p-side metal pillar 23 and the n-side metal pillar 24, preventing the semiconductor layer 15 from being destroyed.

Figure 1B:
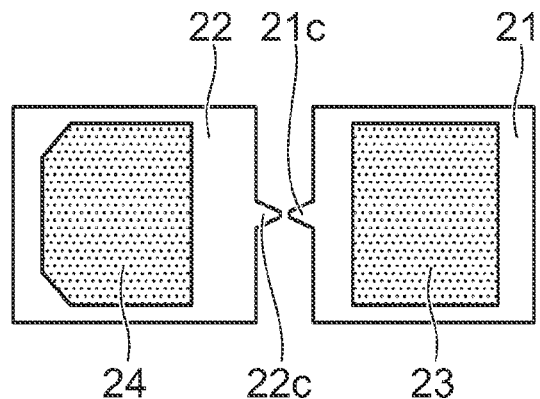

FIG. 1B a plan view schematically illustrating the p-side interconnection and the n-side interconnection seen from the lower surface side in FIG. 1A. Namely, the insulating film 25 is omitted for illustrating the p-side interconnection layer 21 and the n-side interconnection layer 22.

The p-side interconnection layer 21 is provided apart from the n-side interconnection layer 22, and includes a protrusion 21c provided as facing the n-side interconnection layer 22. On the other hand, the n-side interconnection layer 22 includes a protrusion 22c provided as facing the p-side interconnection layer 21.

As shown in FIG. 1B, the tip end of the protrusion 21c is provided opposite to the tip end of the protrusion 22c. The distance between the tip ends provides the minimum gap between the p-side interconnection layer 21 and the n-side interconnection layer 22. The distance between the tip end of the protrusion 21c and the tip end of the protrusion 22c is provided in such a way that a breakdown voltage between the tip ends (a breakdown voltage between the p-side interconnection and the n-side interconnection) is lower than a breakdown voltage between the p-side electrode 16 and the n-side electrode 17.

Namely, the gap between the tip end of the protrusion 21c and the tip end of the protrusion 22c is formed in such a way that a breakdown voltage between the p-side interconnection and the n-side interconnection is lower than the reverse breakdown voltage of the pn junction between the first semiconductor layer 11 and the second semiconductor layer 12. Thereby, the breakdown occurs between the protrusion 21c and the protrusion 22c, and the semiconductor layer 15 can be prevented from destruction, even though ESD is applied through the p-side metal pillar 23 and the n-side metal pillar 24.

Next, a method of manufacturing the semiconductor light emitting device 1 according to the embodiment will be described with reference to FIGS. 2A to 15D. FIGS. 2A to 13B show partial areas of a wafer.

FIG. 2A is a schematic cross-sectional view of the semiconductor layer 15. The semiconductor layer 15 has a stacked body in which a first semiconductor layer 11 and a second semiconductor layer 12 are formed on a major face (the lower face in FIG. 2A) of a substrate 10. FIG. 2B is a schematic view corresponding to a lower face in FIG. 2A.

The first semiconductor layer 11 is formed on the major face of the substrate 10, and the second semiconductor layer 12 including a light emitting layer 13 is formed thereon. For example, the first semiconductor layer 11 and the second semiconductor layer 12 may contain gallium nitride, and grown on a sapphire substrate by using a metal organic chemical vapor deposition (MOCVD) method. Alternatively, a silicon substrate may be used as the substrate 10.

A first face 15a of the semiconductor layer 15 is a face through which the first semiconductor layer 11 is in contact with the substrate 10, and a second face 15b of the semiconductor layer 15 is the surface of the second semiconductor layer 12 opposite to the first semiconductor layer 11, as shown in FIG. 2.

Next, as shown in FIG. 3A, a groove 80 is formed passing through the semiconductor layer 15 and reaching the substrate 10, for example, by using a reactive ion etching (RIE) method using a resist mask (not shown). As shown FIG. 3B corresponding to the lower face of FIG. 3A, the groove 80 is formed, for example, in a lattice pattern on the substrate 10, and separates the semiconductor layer 15 into a plurality of chips on the substrate 10.

Alternatively, the process for separating the semiconductor layer 15 into multiple parts may be performed after selectively removing the second semiconductor layer 12, or after forming the p-side electrode 16 and the n-side electrode.

Figures 4A, 4B:
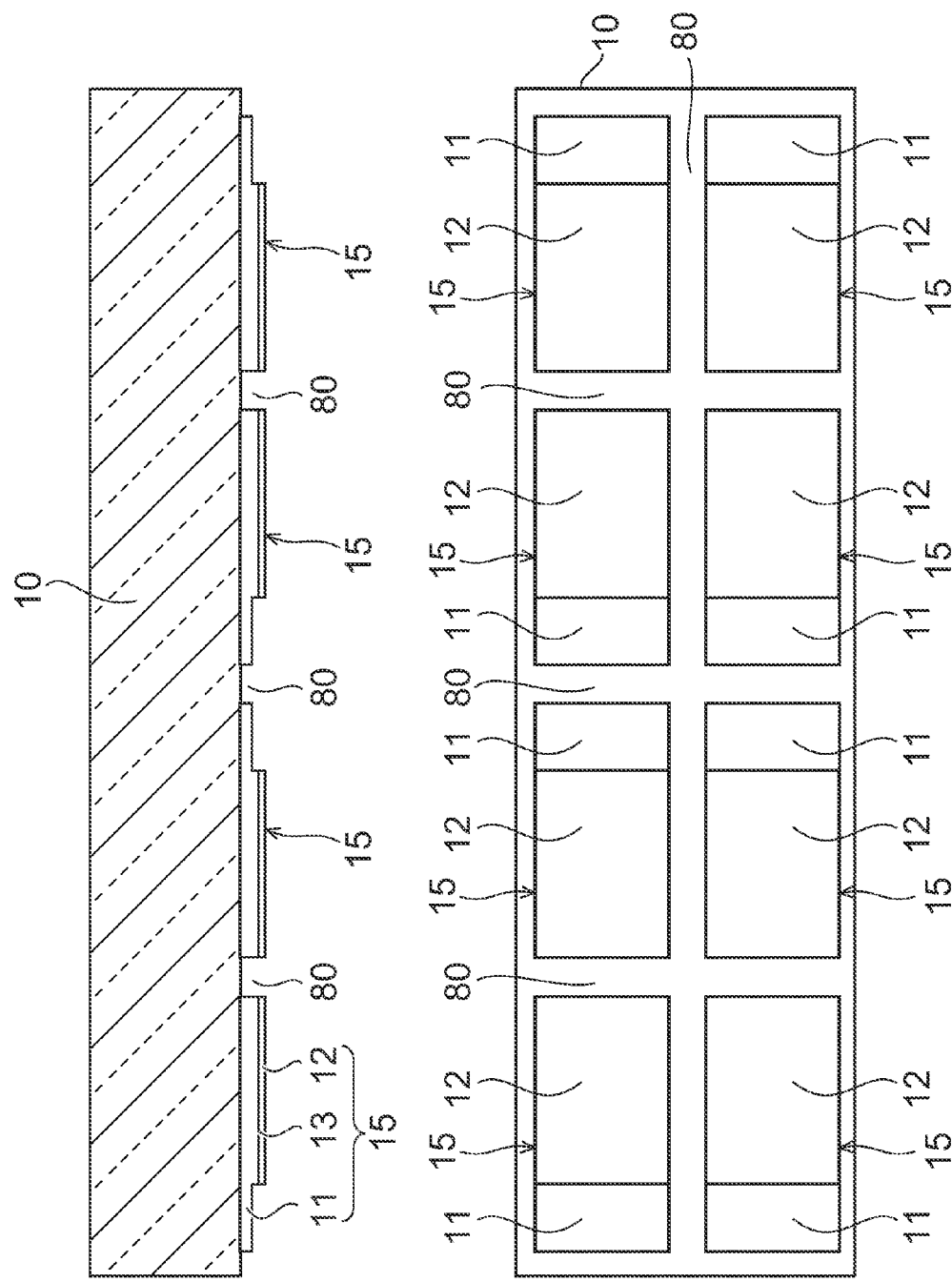

Next, as shown in FIG. 4A and FIG. 4B corresponding to the lower face of FIG. 4A, parts of the second semiconductor layer 12 are removed so as to expose parts of the first semiconductor layer 11, for example, by using the RIE method using a resist mask (not shown).

Each region in which the first semiconductor layer 11 is exposed does not include the light emitting layer 13 as shown in FIG. 4A. An area of the second semiconductor layer 12 that includes the light emitting layer 13 is wider than an area of the region not including the light emitting layer 13, where the first semiconductor layer 11 is exposed, as shown in FIG. 4B.

Next, as shown in FIG. 5A and FIG. 5B corresponding to the lower face of FIG. 5A, p-side electrodes 16 and n-side electrodes 17 are formed on the second face of the semiconductor layer 15. The p-side electrodes 16 are formed on the surfaces of the second semiconductor layer 12. The n-side electrodes 17 are formed on the exposed surfaces of the first semiconductor layer 11.

The p-side electrodes 16 and the n-side electrodes 17, for example, are formed using a sputtering method, a vapor deposition method, or the like. Either the p-side electrodes 16 or the n-side electrodes 17 may be formed first, or the p-side electrode 16 and n-side electrodes 17 may be simultaneously formed and inevitably made of the same material.

The p-side electrode 16 has preferably formed so as to reflect the light emitted from the light emitting layer 13. Hence, the p-side electrode 16 may include silver, silver alloy, aluminum, aluminum alloy, and the like. In addition, the p-side electrode 16 may include a metal protective film (barrier metal) formed on the reflection electrode, in order to prevent the reflection electrode from the sulfurization and the oxidization.

The area of the p-side electrode 16 provided in the region including the light emitting layer 13 is wider than the area of the n-side electrode 17 provided in the region not including the light emitting layer 13. Thereby, a wide light emitting region can be obtained. It is noted that the layout of the p-side electrodes 16 and the n-side electrodes 17 shown in FIG. 5B is an example, and the layout is not limited thereto.

In addition, a silicon nitride film or a silicon oxide film may be formed as a passivation film by using a chemical vapor deposition (CVD) method between the p-side electrode 16 and the n-side electrode 17 or on the end face (side surface) of the light emitting layer 13. In addition, activated annealing may be performed as necessary for forming an ohmic contact between each electrode and the semiconductor layer.

Next, after all the parts formed on the major face of the substrate 10 are covered with an insulating film 18 shown in FIG. 6A, and the insulating film 18 is patterned, for example, by using wet etching, whereby first openings 18a and a second opening 18b are selectively formed in the insulating film 18. A plurality of the first openings 18a are formed in the insulating film 18, and each of the first openings 18a reaches the p-side electrodes 16. The second opening 18b also reaches the n-side electrode 17.

For example, an organic material such as a photosensitive polyimide or benzocyclobutene can be used as the material of the insulating film 18. In such a case, the insulating film 18 can be directly exposed and developed using photo-lithography, and the first and second openings 18a, 18b are directly formed therein without using a resist mask.

Alternatively, an inorganic film such as a silicon nitride film or a silicon oxide film may be used as the insulating film 18. In a case where the insulating film 18 is an inorganic film, the first openings 18a and the second opening 18b are formed using selective etching using a resist mask formed on the insulating film 18.

Next, as shown in FIG. 6B, a metal film 19 is formed on the surface of the insulating film 18, the inner walls (the side wall and the bottom portion) of the first opening 18a, and the inner wall (the side wall and the bottom portion) of the second opening 18b. The metal film 19 is used as a seed metal for plating, which will be described later.

The metal film 19, for example, is formed using a sputtering method. The metal film 19 includes a stacked film, for example, in which a titanium (Ti) layer and a copper (Cu) layer are stacked in order from the insulating film 18 side. Alternatively, an aluminum layer may be used instead of the titanium layer.

Next, as shown in FIG. 6C, resists 91 are selectively formed on the metal film 19, and Cu electroplating is performed using the metal film 19 as a current path.

Figure 7A:
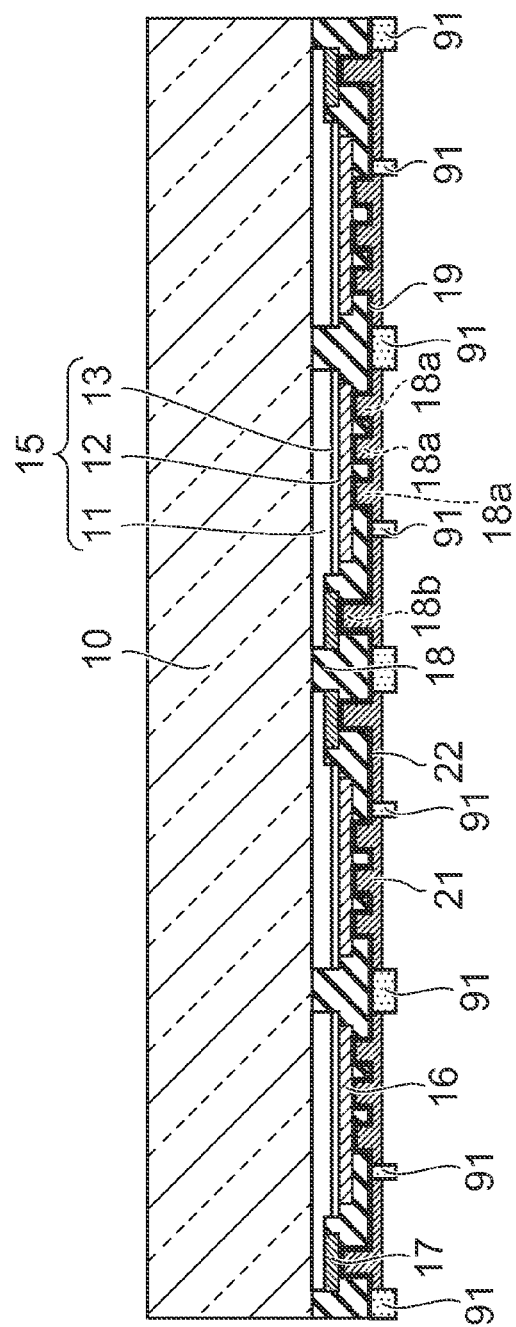
Figure 7B:
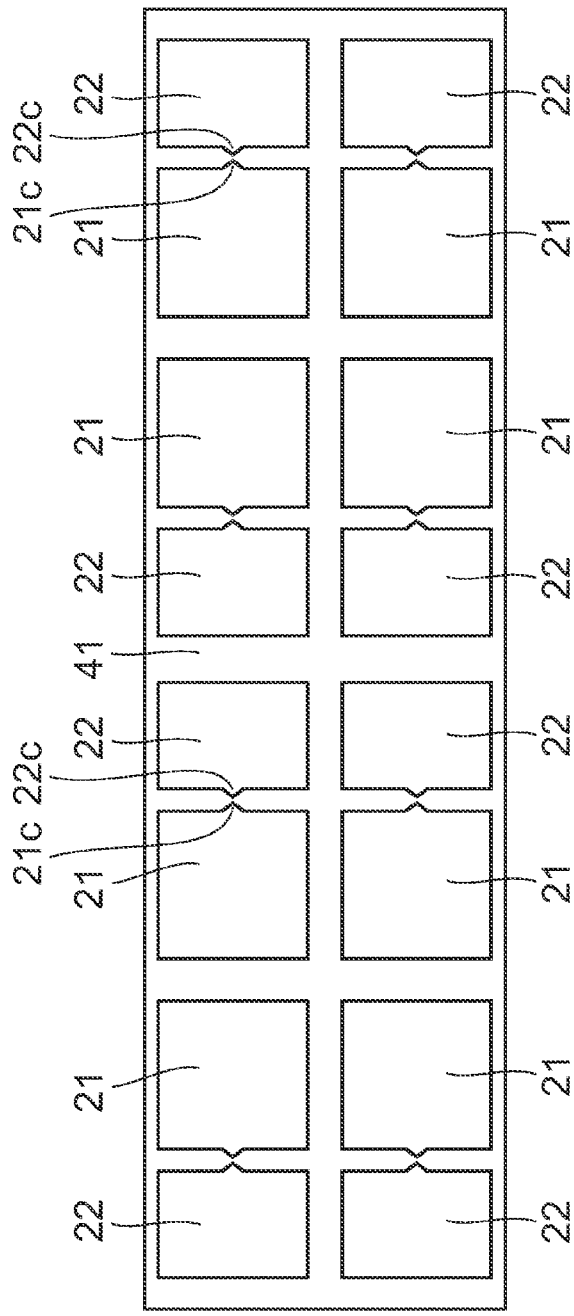

Accordingly, as shown in FIG. 7A and FIG. 7B corresponding to the lower face of FIG. 7A, a p-side interconnection layer 21 and an n-side interconnection layer 22 are selectively formed on the metal film 19. The p-side interconnection layer 21 and the n-side interconnection layer 22 are simultaneously formed, for example, by using copper plating.

The p-side interconnection layer 21 is also formed inside the first openings 18a and is electrically connected to the p-side electrode 16 via the metal film 19. In addition, the n-side interconnection layer 22 is formed also inside the second openings 18b and is electrically connected to the n-side electrodes 17 via the metal film 19.

As shown in FIG. 7B, the protrusion 21c is provided on the side of the p-side interconnection layer 21 opposite to the n-side interconnection layer 22. On the other hand, the protrusion 22c is also provided on the side of the n-side interconnection layer 22 opposite to the p-side interconnection layer 21. The protrusions 21c and 22c are included in the pattern of the resist 91, and the distance between the protrusions 21c and 22c can be controlled by photolithography.

The resists 91 that are used for plating the p-side interconnection layer 21 and the n-side interconnection layer 22 are removed using solvent or oxygen plasma.

Next, as shown in FIG. 8A and FIG. 8B corresponding to the lower face of FIG. 8A, resists 92 are formed for forming metal pillars. The resist 92 is thicker than the above-described resist 91. It may be possible to leave the resists 91 without removing in the previous process, and the resists 92 are formed so as to overlap the resists 91. First openings 92a and second openings 92b are formed in the resists 92.

Then, Cu electroplating is performed using the metal film 19 as a current path and the resists 92 as a mask. Accordingly, as shown in FIG. 9A and FIG. 9B corresponding to the lower face of FIG. 9A, a p-side metal pillar 23 and an n-side metal pillar 24 are formed on the p-side interconnection layer 21 and n-side interconnection layer 22 respectively.

The p-side metal pillar 23 is formed on the p-side interconnection layer 21 inside the first opening 92a that is formed in the resist 92. The n-side metal pillar 24 is formed on the n-side interconnection layer 22 inside the second opening 92b that is formed in the resist 92. The p-side metal pillar 23 and the n-side metal pillar 24 are simultaneously formed using copper plating, for example.

Figure 10A:
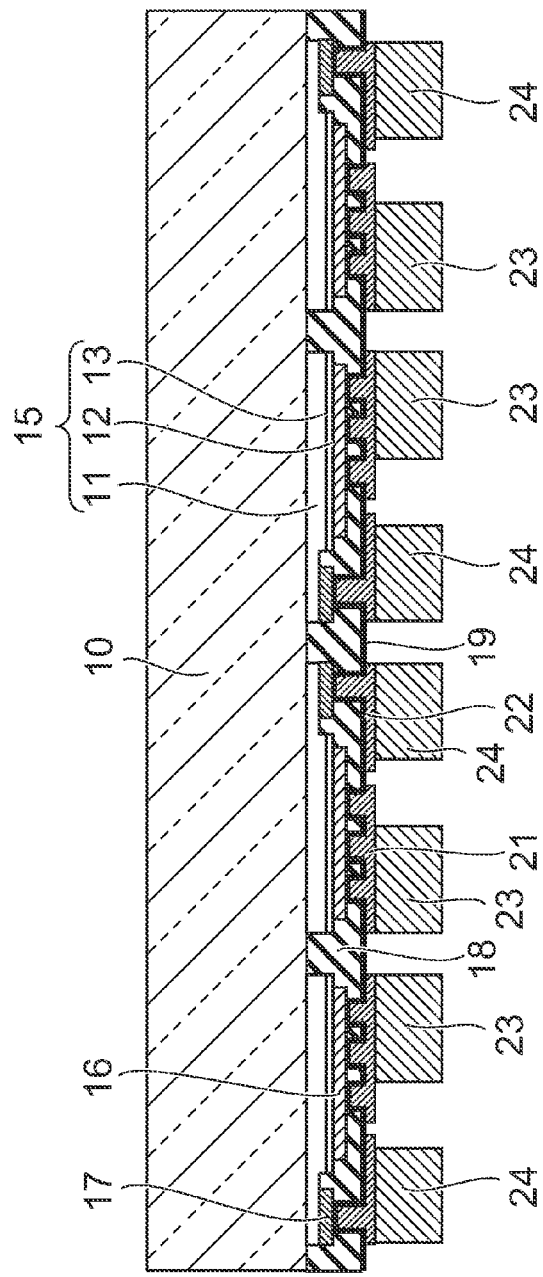
Figure 10B:
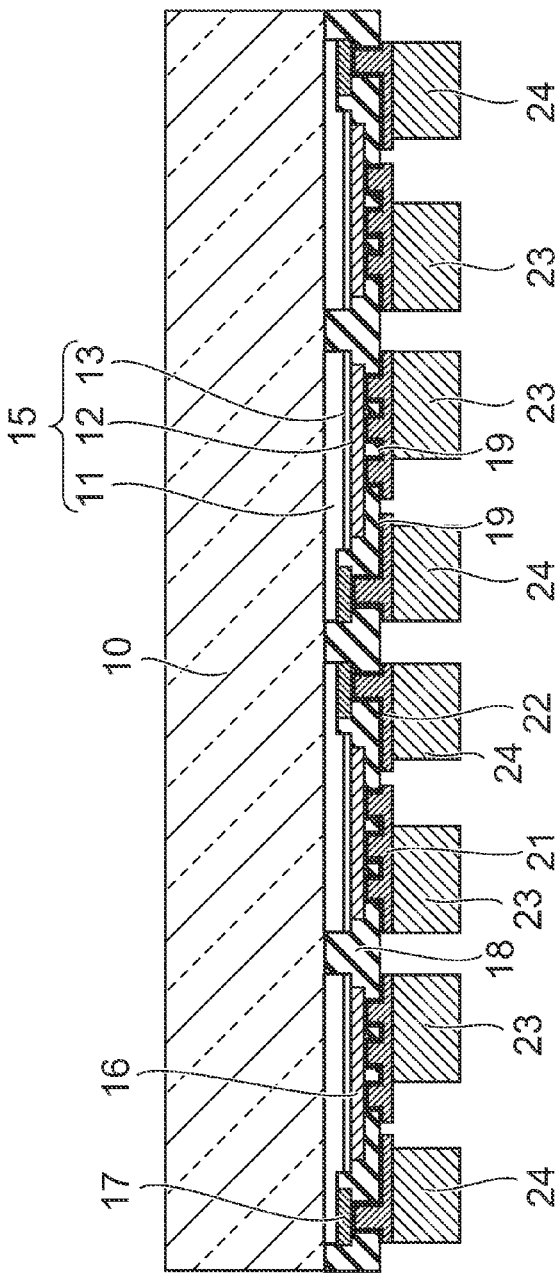

The resist 92, as shown in FIG. 10A is removed, for example, by using solvent or oxygen plasma. Thereafter, exposed parts of the metal film 19 are removed by wet etching while using the p-side metal pillar 23, the n-side metal pillar 24, the p-side interconnection layer 21, and the n-side interconnection layer 22 as a mask. Accordingly, as shown in FIG. 10B, the p-side interconnection layer 21 and the n-side interconnection layer 22 is separated from each other on the insulating film 18, cutting off the electric connection therebetween.

Next, as shown in FIG. 11A, a insulating film 25 is stacked on the insulating film 18. The insulating film 25 covers the p-side interconnection layer 21, the n-side interconnection layer 22, the p-side metal pillar 23, and the n-side metal pillar 24. The insulating film 25 has an insulating property. In addition, for example, carbon black may be dispersed in the insulating film 25 so as to shield the light emitted from the light emitting layer 13.

Next, the substrate 10 is removed as shown in FIG. 11B. In a case where the substrate 10 is a sapphire substrate, the substrate 10 can be removed, for example, using a laser lift-off method. In a case where the substrate 10 is a silicon substrate, the substrate 10 can be removed by etching from the first semiconductor layer 11. The semiconductor layer 15 is reinforced by the p-side metal pillar 23, the n-side metal pillar 24, and the insulating film 25, and accordingly, the wafer shape can be maintained even after the substrate 10 is removed therefrom.

When using a laser lift-off method, laser light is radiated from the backside of the substrate 10 toward the first semiconductor layer 11. The laser light has transparency for the substrate 10 and has a wavelength in an absorption band of the first semiconductor layer 11. When the laser light arrives at an interface between the substrate 10 and the first semiconductor layer 11, part of the first semiconductor layer 11 that is located near the interface absorbs energy of the laser light and decomposes. The first semiconductor layer 11 is decomposed into gallium (Ga) and nitrogen gas. According to the decomposition reaction, a minute gap is formed between the substrate 10 and the first semiconductor layer 11, whereby the substrate 10 and the first semiconductor layer 11 are separated from each other.

The first face 15a of the semiconductor layer 15 is cleaned after removing the substrate 10 therefrom. For example, gallium (Ga) that is stuck to the first face 15a is removed by using rare hydrofluoric acid or the like. Thereafter, wet etching is performed for the first face 15a, for example, by using a potassium hydroxide (KOH) solution, tetramethylammonium hydroxide (TMAH), or the like. Accordingly, the concavo-convex is formed on the first face 15a due to a difference in the etching speed that depends on the direction of the crystal plane, as shown in FIG. 12A. Alternatively, the concavo-convex may be formed on the first face 15a by etching using a resist mask. The concavo-convex formed on the first face 15a may improve the light extraction efficiency.

Next, as shown in FIG. 12B, a phosphor layer 30 is formed on the first face 15a. The phosphor layer 30 is also formed on the insulating film 18 between semiconductor layers 15 adjacent to each other. More specifically, the transparent resin 31 is thermally cured after a transparent resin 31 of a liquid phase in which phosphor particles 32 are dispersed is supplied to the upper side of the first face 15a, for example, using a method such as a printing method, a potting method, a molding method, or a compression molding.

Subsequently, the surface (the lower face in FIG. 12B) of the insulating film 25 is ground such that the p-side external terminals 23a and the n-side external terminals 24a are exposed as shown in FIG. 13A and FIG. 13B corresponding to the lower face of FIG. 13A.

Thereafter, at the position of the above-described groove 80, the transparent film 35, the wafer is diced through the phosphor layer 30, the insulating film 18, and the insulating film 25 so as to separate into a plurality of semiconductor light emitting devices 1. For example, the dicing is performed using a dicing blade. Alternatively, the dicing may be performed using laser radiation. In addition, the semiconductor light emitting device 1 may have a single chip structure that includes one semiconductor layer 15 or a multiple-chip structure that includes a plurality of semiconductor layers 15.

When the dicing is performed, the substrate 10 has been already removed. In addition, since the semiconductor layer 15 is also removed in the groove 80, the semiconductor layer 15 can be prevented from damage, while the dicing is performed. In addition, the end portion (side surface) of the semiconductor layer 15 is covered with the insulating film 18. Thereby, the protection of the end portion can be obtained without any additional process after dicing into the plurality of semiconductor light emitting devices 1.

Since the above-described manufacturing process before dicing are performed in the wafer state, and each diced device includes a package protecting the semiconductor 15 and the interconnection formed therein, it is possible to significantly reduce the production cost. In other words, the interconnection and the packaging are completed at the diced state. Accordingly, it is possible to improve the productivity, and to reduce the manufacturing cost.

Figure 14A:
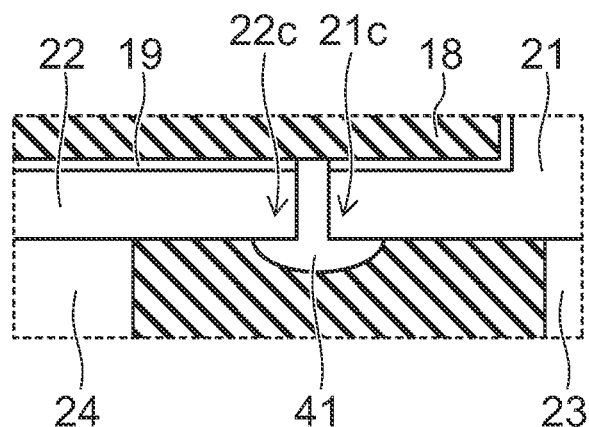
FIGS. 14A and 14B are schematic cross-sectional views illustrating semiconductor light emitting devices according to a variation of the first embodiment.
Figure 14B:
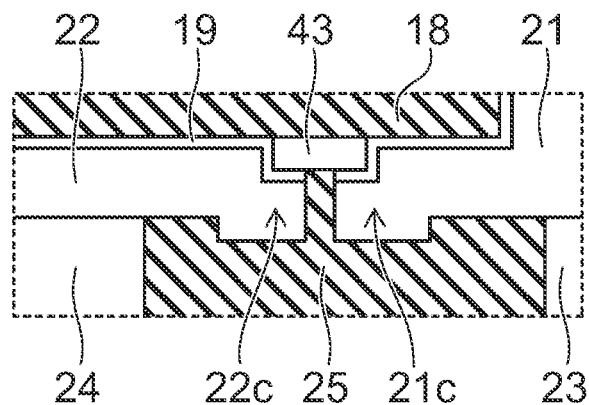

FIG. 14A and FIG. 14B are schematic cross-sectional views illustrating a part of a semiconductor light emitting device according to a variation of the embodiment. FIG. 14A and FIG. 14B are enlarged diagrams of a region A shown in FIG. 1A.

In the structure shown in FIG. 14A, the insulating film 25 covers the p-side interconnection layer 21, the p-side metal pillar 23, the n-side interconnection layer 22, and the n-side metal pillar 24. On the other hand, the insulating film 25 does not cover a portion between the protrusion 21c of the p-side interconnection layer 21 and the protrusion 22c of the n-side interconnection layer 22, forming an air gap 41 between the protrusions 21c and 22c. In this case, discharge occurs between the tip end of the protrusion 21c and the tip end of the protrusion 22c, when a surge voltage is applied between the p-side interconnection and the n-side interconnection, and the tip end of the protrusion 21c is short-circuited to the tip end of the protrusion 22c. Namely, since a surge current passes across the p-side interconnection and the n-side interconnection not through the semiconductor layer 15, the semiconductor layer 15 can be protected from the discharge. Discharge between the protrusion 21c and the protrusion 22c can be repeated, and a change in the breakdown voltage is small. Accordingly, the semiconductor layer 12 can be stably protected from ESD applied repeatedly.

The resin (the insulating film 25) filled between the p-side interconnection and the n-side interconnection with the preferably adjusted viscosity, for example, may form the air gap 41 between the protrusion 21c and the protrusion 22c. Since the resin of high viscosity does not enter the narrow gap between the protrusion 21c and the protrusion 22c, the resin viscosity is preferably adjusted according to the distance between the protrusion 21c and the protrusion 22c, so that the air gap 41 is formed in a convincing way.

In the structure shown in FIG. 14B, a varistor layer 43 is disposed between the protrusion 21c and the protrusion 22c. Thus, the resistance between the protrusion 21c and the protrusion 22c is changed depending on a voltage applied between the p-side interconnection and the n-side interconnection. Namely, in the case where a high voltage is applied between the p-side interconnection and the n-side interconnection, the resistance between the protrusion 21c and the protrusion 22c becomes lower, and thereby a pathway to release a surge current is formed between the protrusion 21c and the protrusion 22c.

More specifically, for example, the varistor layer 43 including $BaTiO_3$ is selectively formed on the insulating film 18, and the protrusion 21c and the protrusion 22c are provided on the varistor layer 43. Alternatively, a resin in which varistor material is dispersed may be used for forming the insulating film 25.

Figure 15A:
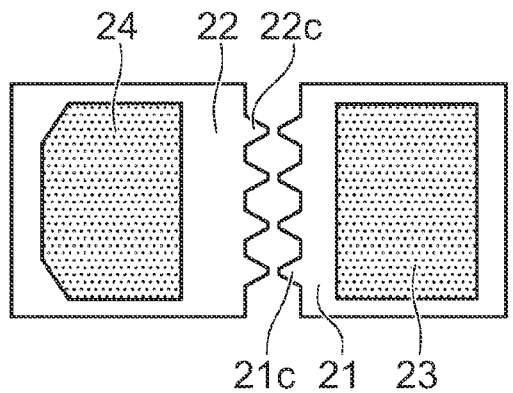
FIGS. 15A and 15D are schematic cross-sectional views illustrating semiconductor light emitting devices according to another variations of the first embodiment.
Figure 15B:
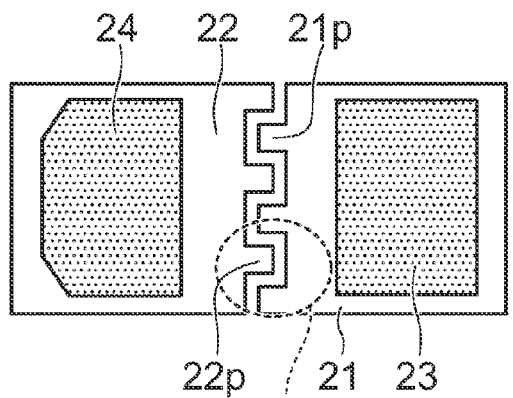
Figure 15C:
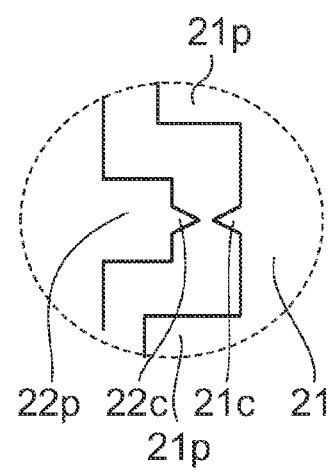
Figure 15D:
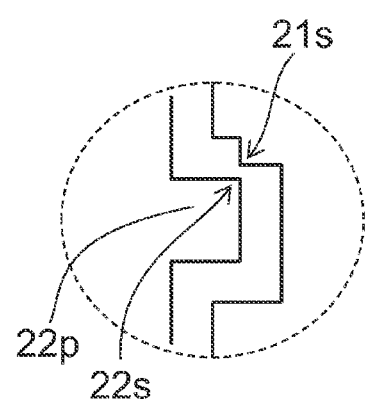

FIG. 15A to FIG. 15D are plan views of the p-side interconnection and the n-side interconnection of a semiconductor light emitting device according to other variations of the embodiment. It is noted that FIG. 15C and FIG. 15D are enlarged diagrams of a region B in FIG. 15B.

As shown in FIG. 15A, a plurality of the protrusions 21c may be provided on the side of the p-side interconnection layer 21 opposite to the n-side interconnection layer 22, and a plurality of the protrusions 22c may be provided on the side of the n-side interconnection layer 22 opposite to the p-side interconnection layer 21. The protrusions 21c provided on the p-side interconnection layer 21 individually face any one of the protrusions 22c provided on the n-side interconnection layer 22. In the case where a surge voltage is applied between the p-side interconnection and the n-side interconnection, the surge current is bypassed through any one of the protrusions 21c and the protrusions 22c facing each other. Accordingly, the semiconductor layer 15 can be stably protected.

In an example shown in FIG. 15B, a plurality of projections 21p are provided on the side of the p-side interconnection layer 21 opposite to the n-side interconnection layer 22, and a plurality of projections 22p are provided on the side of the n-side interconnection layer 22 opposite to the p-side interconnection layer 21. The projections 21p individually extend between the adjacent projections 22p of the n-side interconnection layer 22. Such a nesting structure of the projections may reduce stress generated between the p-side interconnection layer 21 and the n-side interconnection layer 22 by distributing along the sides of the n-side and p-side interconnections.

As shown in FIG. 15C, the protrusion 21c is provided on the side of the p-side interconnection layer 21 opposite to the n-side interconnection layer 22, and the protrusion 22c is provided on the side of the n-side interconnection layer 22 opposite to the p-side interconnection layer 21. In this example, the protrusion 21c is formed on a recess between the projections 21p of the p-side interconnection layer 21, and the protrusion 22c is formed on the top of the projection 22p of the n-side interconnection layer 22. The disposition of the protrusion 21c and the protrusion 22c shown here is an example. The protrusion 21c and the protrusion 22c may be formed on any locations on the projections 21p and 22p. A plurality pair of the protrusions 21c and 22c may be provided between the n-side and p-side interconnections.

As shown in FIG. 15D, a corner 22s of the projection 22p provided on the n-side interconnection layer 22 may be disposed so as to face a protrusion 21s provided on the corner of the recess of the p-side interconnection layer 21.

FIG. 16A to FIG. 16D are plan views schematically showing the p-side interconnection and the n-side interconnection of a semiconductor light emitting device according to other variations of the embodiment. A broken line shown in FIG. 16A to FIG. 16D is the outer edge of the semiconductor layer 15.

Figure 16A:
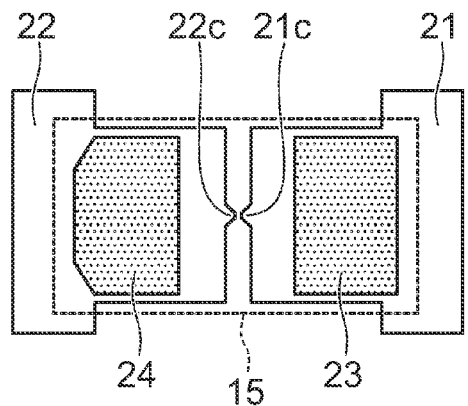
FIGS. 16A to 16D are schematic cross-sectional views illustrating semiconductor light emitting devices according to the other variations of the first embodiment.

In FIG. 16A, the p-side interconnection layer 21 and the n-side interconnection layer 22 extend transversely in FIG. 16A, and extend beyond the outer edge of the semiconductor layer 15. The protrusion 21c is provided on the side of the p-side interconnection layer 21 opposite to the n-side interconnection layer 22, and the protrusion 22c is provided on the side of the n-side interconnection layer 22 opposite to the p-side interconnection layer 21.

Figure 16B:
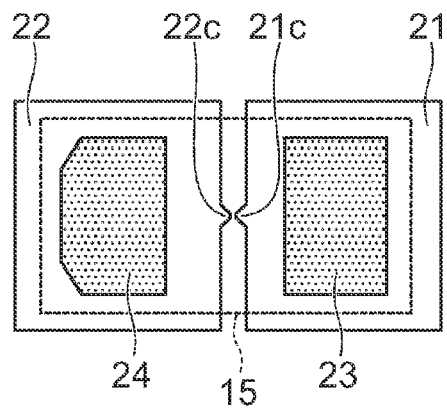

In FIG. 16B, the p-side interconnection layer 21 and the n-side interconnection layer 22 extend beyond the outer edge of the semiconductor layer 15. Namely, the p-side interconnection layer 21 and the n-side interconnection layer 22 are provided so as to cover the semiconductor layer 15.

Figure 16C:
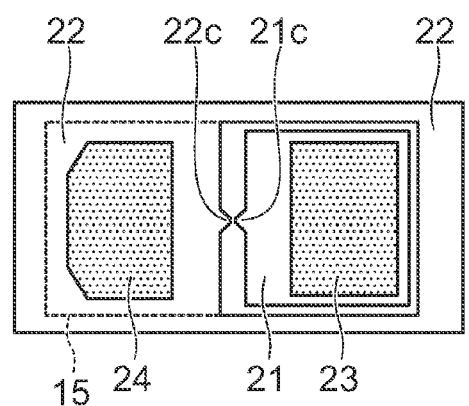

In FIG. 16C, the p-side interconnection layer 21 is provided on the semiconductor layer 15, and the n-side interconnection layer 22 extends beyond the outer edge of the semiconductor layer 15. The n-side interconnection layer 22 is provided so as to surround the periphery of the p-side interconnection layer 21.

Figure 16D:
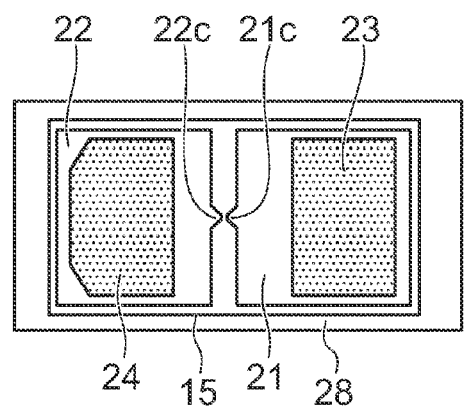

In FIG. 16D, the p-side interconnection layer 21 and the n-side interconnection layer 22 are provided on the semiconductor layer 15. An interconnection 28 surrounding the p-side interconnection layer 21 and the n-side interconnection layer 22 is provided along the outer periphery of the semiconductor layer 15.

As described above, the p-side interconnection layer 21 and the n-side interconnection layer 22 are extend on the outer side of the semiconductor layer 15, or another interconnection is provided, so as to cover the semiconductor layer 15. On the other hand, as shown in FIG. 16A to FIG. 16D, the p-side metal pillar 23 and the n-side metal pillar 24 are provided on the semiconductor layer 15.

Although a pair of the protrusions 21c and 22c are provided in these examples, plurality pairs of the protrusion 21c and the protrusion 22c may be formed on a side of the p-side interconnection layer 21 and a side of the n-side interconnection lay 22 opposite to each other. As described above, the protrusions 21c and 22c are provided on the sides of the interconnection layers opposite to each other, so that a surge current is bypassed theretrough, and it becomes possible to protect the semiconductor layer 15 from ESD.

As an alternative example of the embodiment, the p-side interconnection layer 21 and the n-side interconnection layer 22 may be directly bonded to the pads of the mounting substrate without providing the p-side metal pillar 23 and the n-side metal pillar 24. Furthermore, the p-side interconnection layer 21 and the p-side metal pillar 23 are not limited to be the separately formed ones, and the p-side interconnection may be provided with the p-side interconnection layer 21 and the p-side metal pillar 23, which are formed into a single body in the same process. Similarly, the n-side interconnection layer 22 and the n-side metal pillar 24 are not limited to be the separately formed ones, and the n-side interconnection may be provided with the n-side interconnection layer 22 and the n-side metal pillar 24, which is formed into a single body in the same process.

Second Embodiment

Figure 17:
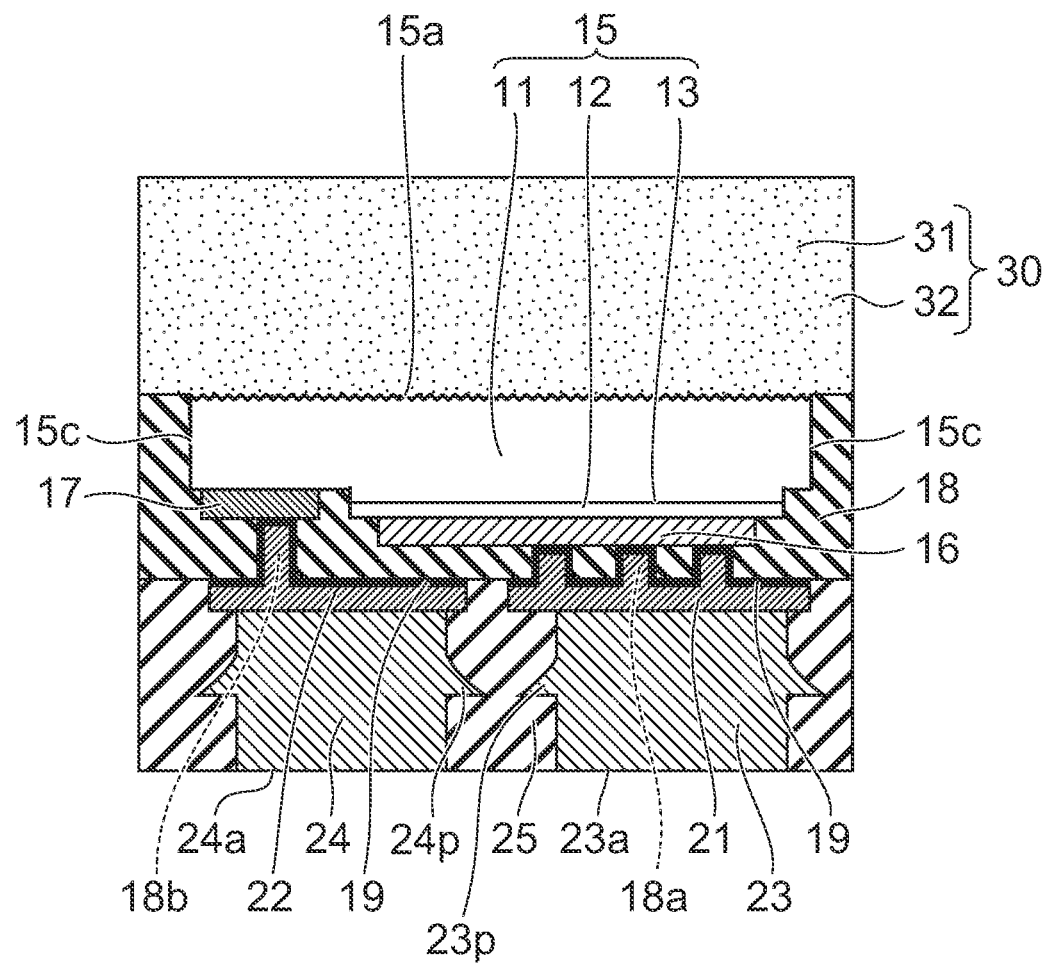
FIG. 17 is a schematic cross-sectional view illustrating a semiconductor light emitting device according to a second embodiment.

FIG. 17 is a schematic view of a semiconductor light emitting device 2 according to a second embodiment. In the embodiment, a p-side metal pillar 23 is provided on a p-side interconnection, and an n-side metal pillar 24 is provided on an n-side interconnection. The p-side metal pillar 23 includes a protrusion 23p, and the n-side metal pillar 24 includes a protrusion 24p. The protrusion 23p provided on the p-side metal pillar 23 is provided, so as to face the n-side metal pillar 24, and the protrusion 24p provided on the n-side metal pillar 24 is provided, so as to face the p-side metal pillar 23.

In the embodiment, for example, the protrusions 21c and 22c are not provided on the p-side interconnection layer 21 and the n-side interconnection layer 22, and a gap between the tip end of the protrusion 23p and the tip end of the protrusion 24p is the minimum gap between the p-side interconnection and the n-side interconnection. A breakdown voltage between the protrusion 23p and the protrusion 24p is lower than a breakdown voltage between a p-side electrode 16 and an n-side electrode 17 provided on the semiconductor layer 15. Thus, a surge applied between the p-side interconnection and the n-side interconnection is bypassed through a current path between the protrusion 23p and the protrusion 24p, and the semiconductor layer 15 can be protected from ESD.

Also in the embodiment, the viscosity of a resin (an insulating film 25) filled between the p-side metal pillar 23 and the n-side metal pillar 24 is adjusted, so as to form an air gap between the protrusion 23p and the protrusion 24p. A resin including varistor material may be filled between the p-side metal pillar 23 and the n-side metal pillar 24.

Next, a method for manufacturing the semiconductor light emitting device 2 will be described with reference to FIG. 18A to FIG. 18D. FIG. 18A to FIG. 18D are schematic-cross sectional views illustrating a portion of a wafer.

Figure 18A:
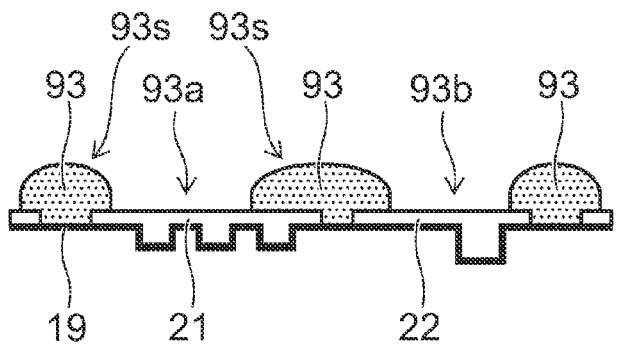
FIGS. 18A to 18D are schematic cross-sectional views illustrating a manufacturing process of the semiconductor light emitting device according to the second embodiment.

FIG. 18A shows a resist 93 formed on the surface of the wafer on which the p-side interconnection layer 21 and the n-side interconnection layer 22 are provided (see FIG. 8A). The resist 93 includes an opening 93a in which the p-side metal pillar 23 is formed and an opening 93b in which the n-side metal pillar 24 is formed. The resist 93 is subjected to heat treatment after patterning for rounding a shoulder 93s thereof.

Figure 18B:
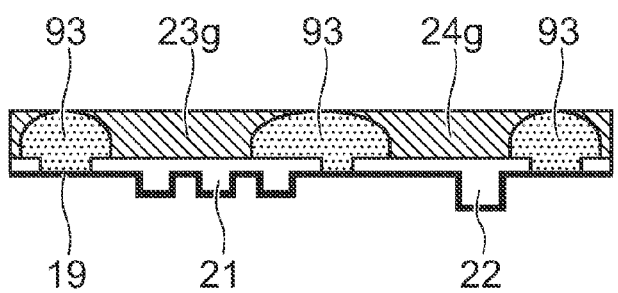

Subsequently, electrolytic copper plating is implemented using a seed layer (not shown) and a portion 23g of the p-side metal pillar and a portion 24g of the n-side metal pillar are formed as shown in FIG. 18B. The portion 23g of the p-side metal pillar and the portion 24g of the n-side metal pillar are formed in such a way that the portions 23g and 24g protrude transversely along the shoulder 93s of the resist 93.

Figure 18C:
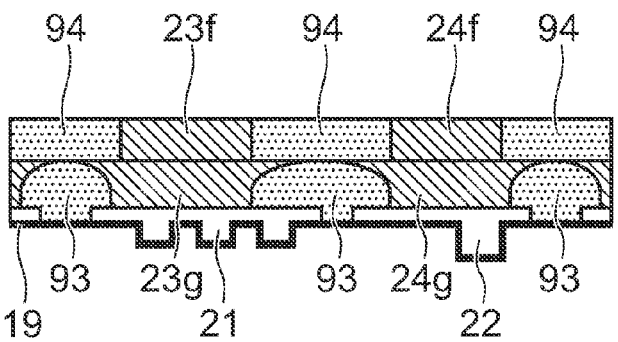

Subsequently, a resist 94 is further provided on the resist 93, and a remaining portion 23f of the p-side metal pillar 23 and a remaining portion 24f of the n-side metal pillar 24 are formed as shown in FIG. 18C. The remaining portions 23f and 24f are provided on the inner side of the protrusions of the portions 23g and 24g.

Figure 18D:
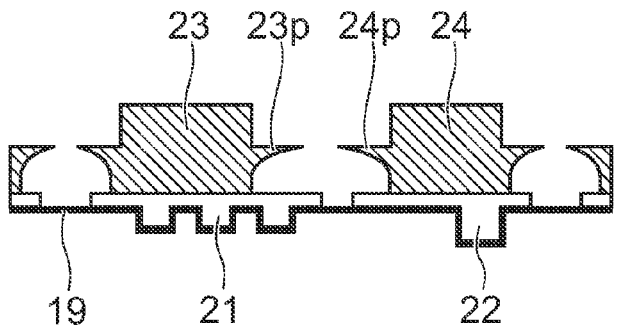

Subsequently, the resist 93 and the resist 94 are removed as shown in FIG. 18D. Thus, the p-side metal pillar 23 and the n-side metal pillar 24 can be formed, from which the protrusions 23p and 24p protrude respectively.

In the processes described above, the protrusions 23p and 24p are formed in a flange shape on the peripheries of the p-side metal pillar 23 and the n-side metal pillar 24, respectively. In the state in which the semiconductor light emitting device 2 is finally separated into dies, the pathway of the surge current is formed in the portion where the protrusion 23p and 24p are opposite to each other.

The embodiment described above is one example and not limited thereto. For example, a resist pattern may be provided for forming protrusions. In this case, the protrusions 23p and 24p can be formed only on the portion at which the p-side metal pillar 23 and the n-side metal pillar 24 finally face each other.

Third Embodiment

Figure 19A:
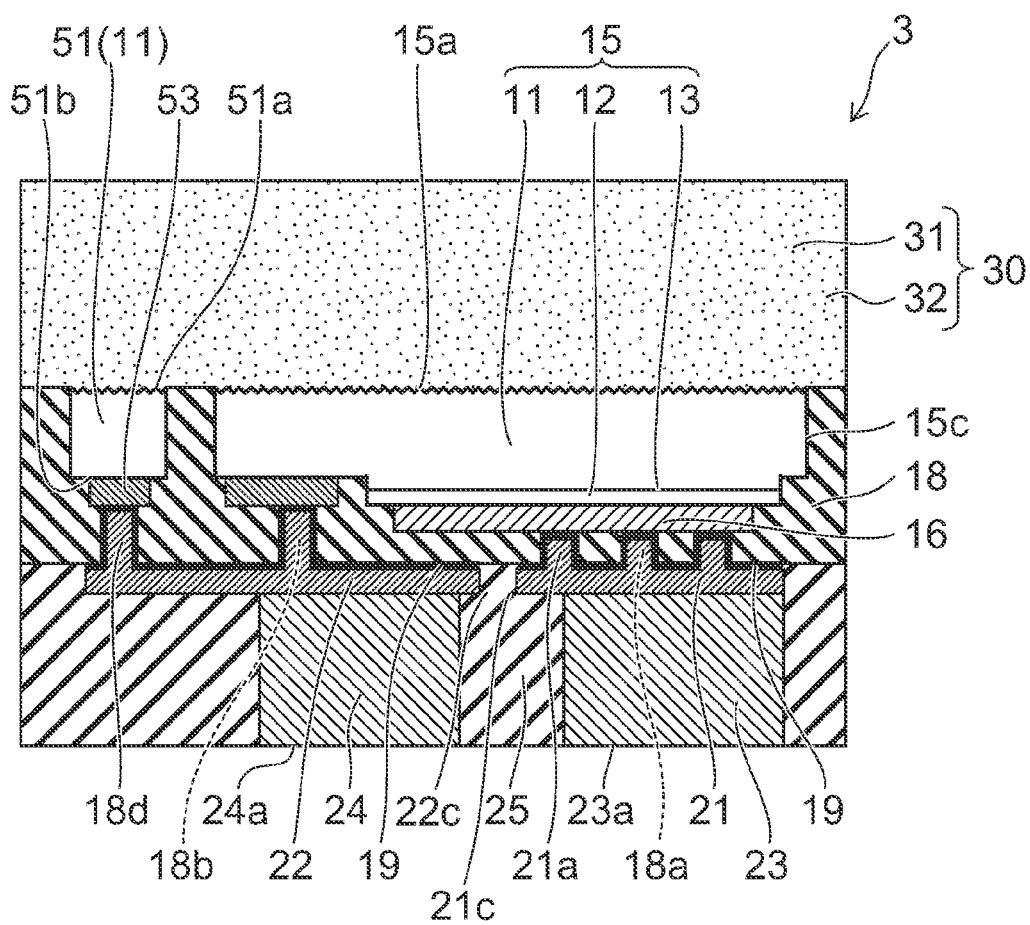
FIGS. 19A and 19B are schematic views illustrating a semiconductor light emitting device according to a third embodiment.
Figure 19B:
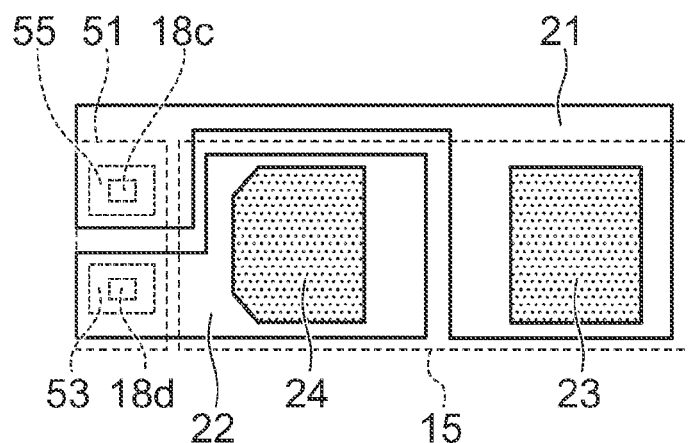

FIG. 19A and FIG. 19B are schematic views of a semiconductor light emitting device 3 according to a third embodiment. FIG. 19A is a schematic cross-sectional view of the semiconductor light emitting device 3, and FIG. 19B is a plan view of a p-side interconnection and an n-side interconnection. FIG. 19B shows the lower surface, removing an insulating film 25.

The semiconductor light emitting device 3 includes a semiconductor layer 15 (a first semiconductor layer) having a light emitting layer 13 and a semiconductor layer 51 (a second semiconductor layer) provided side by side with the semiconductor layer 15.

The semiconductor layer 15 includes a first face 15a and a second face 15b opposite to the first face 15a, and electrodes and interconnections are provided on the second face side. The semiconductor layer 15 emits light outward from the light emitting layer 13 through the first face 15a.

The semiconductor layer 15 and a p-side electrode 16 (a first electrode) and an n-side electrode (a second electrode) 17 are provided on the second face with the same manner as in the semiconductor light emitting device 1.

The semiconductor layer 51 includes an electrode 55 (a third electrode) and an electrode 53 (a fourth electrode) on the second face 51b. The second face 15b of the semiconductor layer 15 and the second face 51b of the semiconductor layer 51 are located on the same side.

An insulating film 18 (a first insulating film) covering the semiconductor layer 15 also covers the semiconductor layer 51. The insulating film 18 includes a first opening 18a communicated with the p-side electrode 16, a second opening 18b communicated with the n-side electrode 17, a third opening 18c communicated with the electrode 55, and a fourth opening 18d communicated with the electrode 53.

The p-side interconnection (a first interconnection) includes a p-side interconnection layer 21, a p-side metal pillar 23, and a metal film 19. The p-side interconnection layer 21 is provided on the insulating film 18, and electrically connected to the p-side electrode 16 through the first opening 18a. As shown in FIG. 19B, the p-side interconnection layer 21 extends on the semiconductor layer 51, and electrically connected to the electrode 55 through the third opening 18c.

On the other hand, the n-side interconnection (a second interconnection) is provided on the insulating film 18, and includes an n-side interconnection layer 22, an n-side metal pillar 24, and the metal film 19. The n-side interconnection layer 22 extends on the semiconductor layer 51, and electrically connected to the electrode 53 through the fourth opening 18d.

The insulating film 25 (a second insulating film) covering the p-side interconnection and the n-side interconnection is provided on the insulating film 18.

On the other hand, micro projections and depressions are formed on the first face 15a of the semiconductor layer 15 and the first face 51a of the semiconductor layer 51. The projections and depressions are provided on the first face 15a, which is the main surface of extracting light emitted from the light emitting layer 13. Thereby, the light emitted from the light emitting layer 13 can be extracted outward through the first face 15a, suppressing the total reflection of the light entering the first face 15a at various angles.

A phosphor layer 30 is provided on the first faces 15a and 51a. The phosphor layer 30 includes a transparent resin 31 and a phosphor 32 dispersed in the transparent resin 31, for example. The phosphor 32 absorbs light (pumping light) emitted from the light emitting layer 13, and emits wavelength converted light. The semiconductor light emitting device 3 emits the mixed light including the light emitted from the light emitting layer 13 and the wavelength converted light emitted from the phosphor 32.

The semiconductor layer 51 includes a first semiconductor layer 11, and is initially a part of the semiconductor layer 15. For example, in the process of forming the groove 80 shown in FIG. 3, the semiconductor layer 51 is formed by partially separating the region not including the light emitting layer 13. The electrode 55 is provided to be in ohmic contact with the first semiconductor layer 11 and the electrode 53 is provided to be in Schottky contact with the first semiconductor layer 11.

In the manufacturing processes shown in the first embodiment, the electrode 55 may include titanium (Ti), for example, and the electrode 55 can be formed in the common process with the n-side electrode 17. In the embodiment, the process of forming the electrode 53 is additionally provided. For the electrode 53, a metal film including aluminum (Al) can be used, for example.

Figure 20:
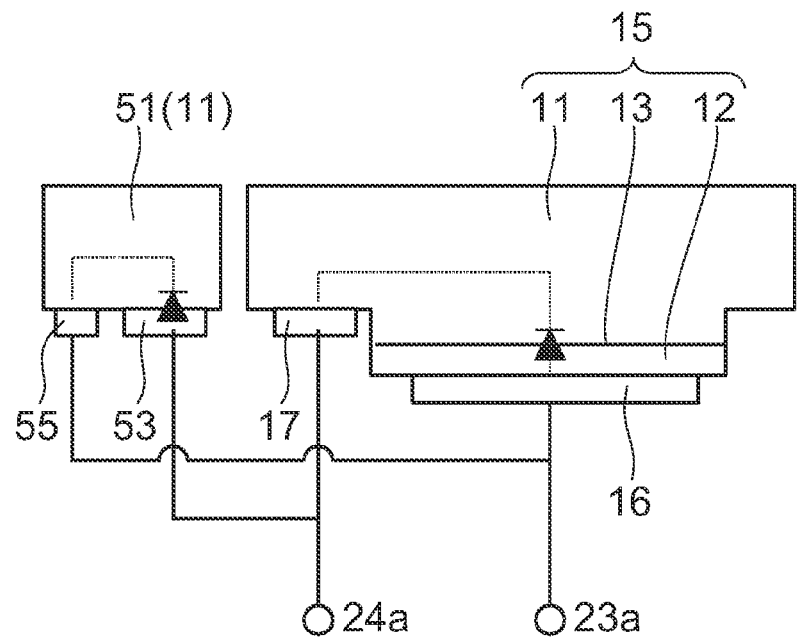
FIG. 20 is a schematic view illustrating interconnections of the semiconductor light emitting device according to the third embodiment.

FIG. 20 is a schematic view illustrating the interconnections of the semiconductor light emitting device 3 according to the third embodiment. As shown in FIG. 20, the p-side electrode 16 and the electrode 55 are connected to a p-side external terminal 23a through the p-side interconnection (the p-side interconnection layer 21). On the other hand, the n-side electrode 17 and the electrode 53 are connected to an n-side external terminal 24a through the n-side interconnection (the n-side interconnection layer 21).

The semiconductor layer 15 is a light emitting diode (LED), that is, a pn-type diode, and the semiconductor layer 51 is a Schottky diode. In the embodiment, the diodes are interconnected in such a way that the rectifying directions of the diodes connected between the p-side external terminal 23a and the n-side external terminal 24a are inverted to each other. Namely, between the p-side external terminal 23a and the n-side external terminal 24a, the current passing through the semiconductor layer 15 flows in reverse direction of the current passing through the semiconductor layer 51.

When a surge voltage is applied between the p-side external terminal 23a and the n-side external terminal 24a, a forward current passes through any one of the semiconductor layer 15 and the semiconductor layer 51. Thus, the semiconductor layer 15 can be protected from ESD by suppressing excessive reverse current.

Table 1 is examples of the reverse current and the forward current of a Schottky diode provided on the semiconductor layer 51, corresponding to the forward leakage current and the reverse current in the semiconductor light emitting device 3. The currents depend on the size of the Schottky diode (the size of the electrode 53). Namely, the size of the electrode 53 is appropriately selected, so that desired characteristics can be obtained.

TABLE 1

| Schottky size (μm) | LED forward leakage current (μA) | LED reverse current (mA) |
| --- | --- | --- |
| 200 | 0.04 | 0.04 |
| 100 | 0.01 | 0.01 |
| 50 | 0.0025 | 0.0025 |

Figure 21:
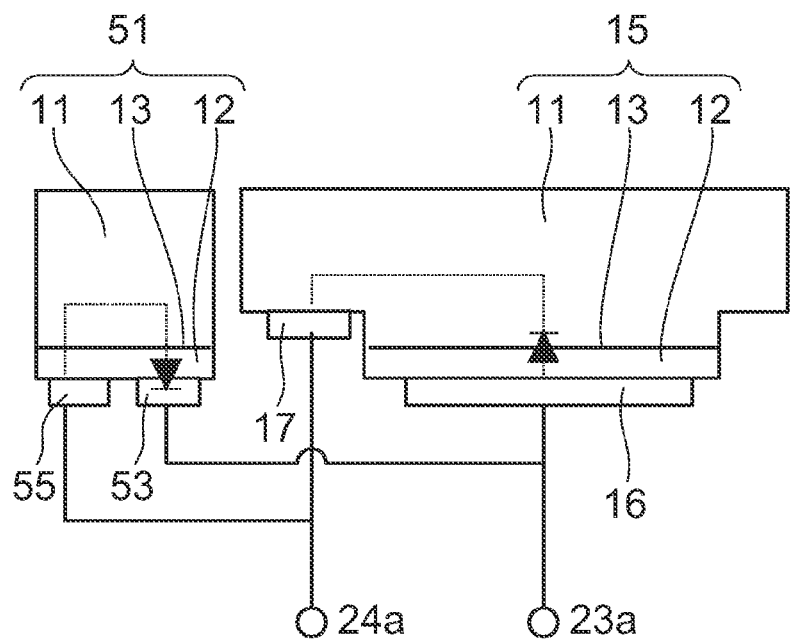
FIG. 21 is a schematic view illustrating interconnections of a semiconductor light emitting device according to a variation of the third embodiment.

FIG. 21 is a schematic view of a semiconductor light emitting device according to a variation of the third embodiment. The semiconductor layer 51 includes the first semiconductor layer 11, the second semiconductor layer 12, and the light emitting layer 13. The electrode 53 and the electrode 55 are provided on the second semiconductor layer 12. The electrode 53 is in Schottky contact with the second semiconductor layer, and the electrode 55 is in ohmic contact with the second semiconductor layer.

The electrode 53 includes Ti and tungsten (W), for example. The electrode 55 includes nickel (Ni) and gold (Au), for example. Different from the interconnections in FIG. 19B, the electrode 53 is connected to the external terminal 23a through the p-side interconnection layer 21. On the other hand, the electrode 55 is connected to the external terminal 24a through the n-side interconnection layer 22.

Figure 22:
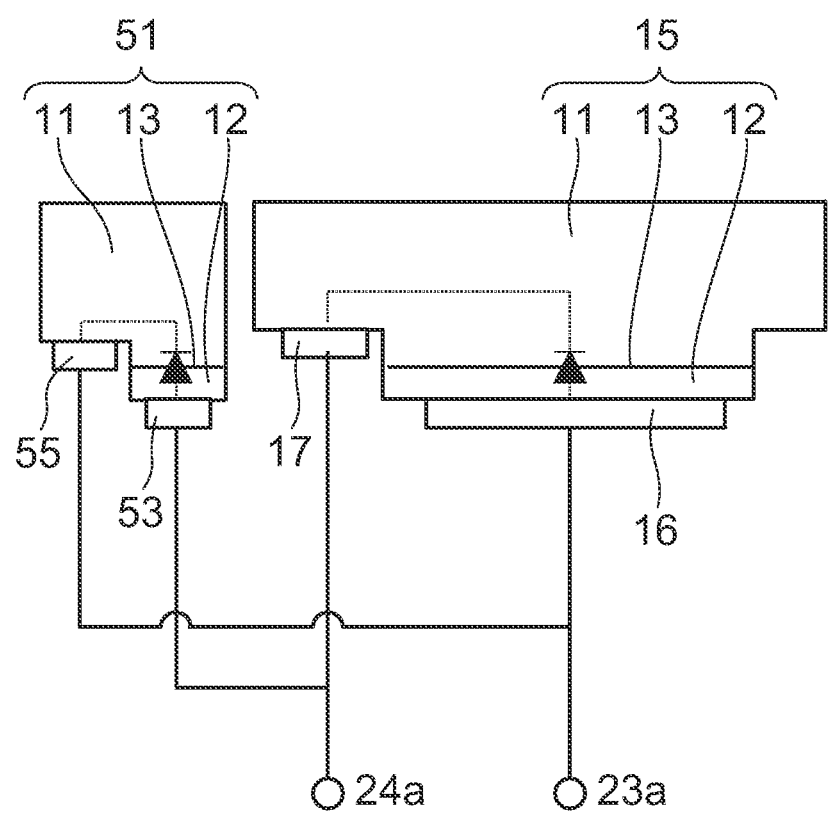
FIG. 22 is a schematic view illustrating interconnections of a semiconductor light emitting device according to another variation of the third embodiment.

FIG. 22 is a schematic view of a semiconductor light emitting device according to another variation of the third embodiment. The semiconductor layer 51 is a pn junction diode including the first semiconductor layer 11, the second semiconductor layer 12, and the light emitting layer 13. The electrode 53 is provided on the second semiconductor layer 12, and the electrode 55 is provided on the first semiconductor layer 11.

The electrode 53 can be formed simultaneously together with the p-side electrode 16, for example, and the electrode 55 can be formed simultaneously together with the n-side electrode 17, for example. The electrode 55 is connected to the external terminal 23a through the p-side interconnection layer 21. On the other hand, the electrode 53 is connected to the external terminal 24a through the n-side interconnection layer 22.

As described above, in the embodiment, the semiconductor layer 51 is provided together with the semiconductor layer 15. The semiconductor layer 51 is a part of the semiconductor layer 15, and includes a Schottky diode or a pn junction diode. The semiconductor layer 15, which is an LED, is connected to the semiconductor layer 51, which is a protection diode, through the p-side interconnection layer 21 and the n-side interconnection layer 22. Thus, an ESD protection element can be built in the chip size package.

Fourth Embodiment

Figure 23A:
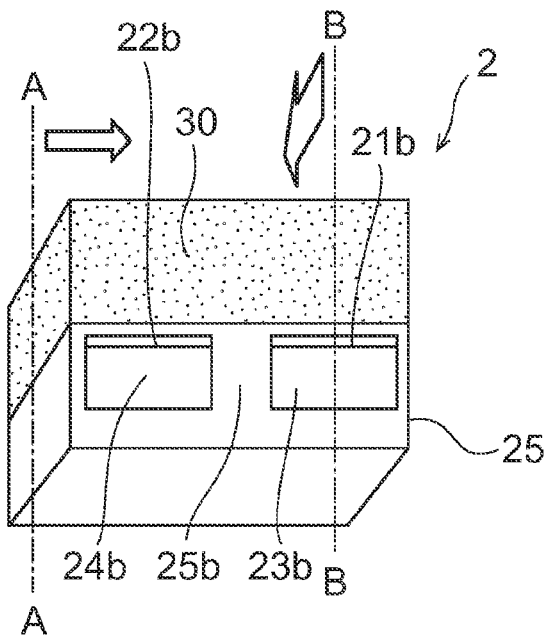
FIGS. 23A to 23C are schematic views illustrating a semiconductor light emitting device according to a fourth embodiment.
Figure 23B:
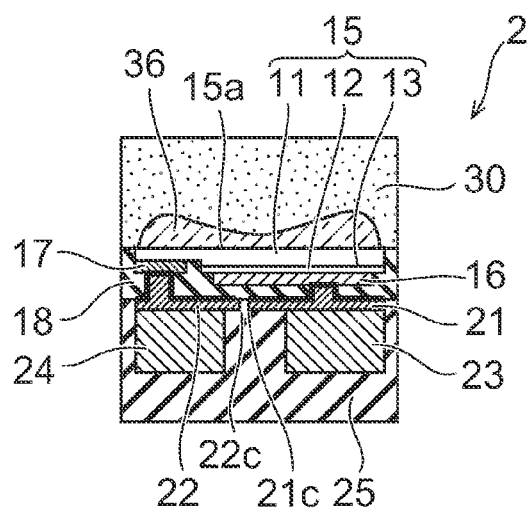
Figure 23C:
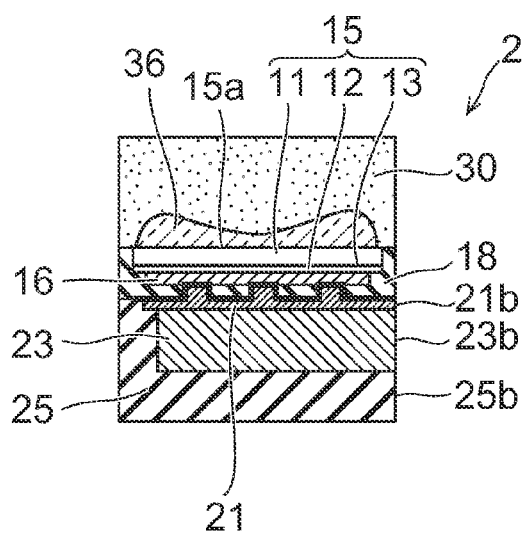
Figure 24:
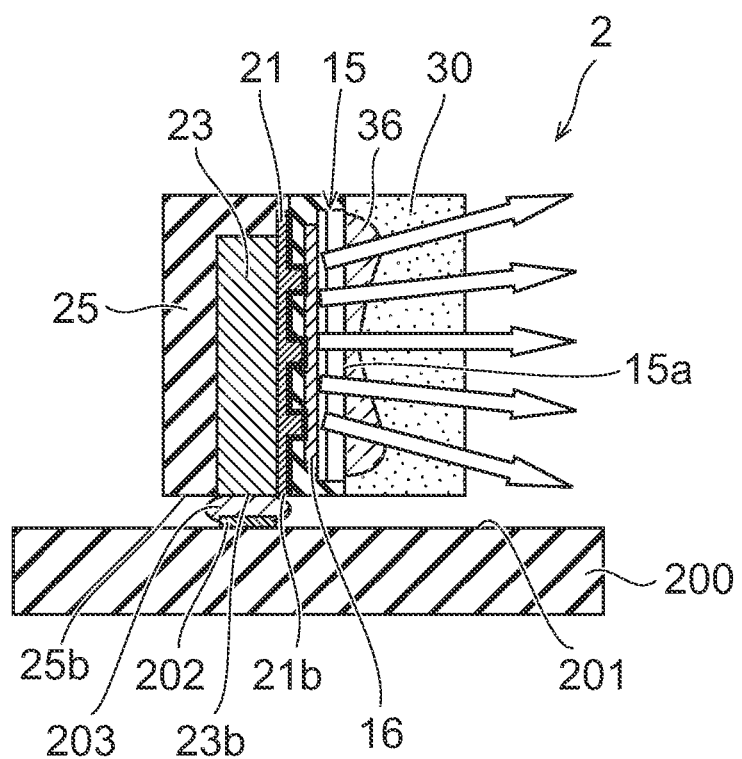
FIG. 24 is a schematic cross-sectional view illustrating the light emitting device shown in FIGS. 23A to 23C, which is mounted on a substrate.

FIG. 23A is a schematic perspective view of a semiconductor light emitting device 4 according to a fourth embodiment. FIG. 23B is a cross-sectional view taken along line A-A shown in FIG. 23A. FIG. 23C is a cross-sectional view taken along line B-B shown in FIG. 23A. FIG. 24 is a schematic cross-sectional view of a light emitting module that has a configuration in which the semiconductor light emitting device 4 is mounted on a mounting substrate 200.

As shown in FIGS. 23A and 23C, a part of the side surface of the p-side metal pillar 23 is exposed from the insulating film 25 on a third face 25b that has a plane direction different from the first face 15a and the second face of the semiconductor layer 15. The exposed face serves as a p-side external terminal 23b for mounting the semiconductor light emitting device on an external mounting substrate.

The third face 25b is a face that is approximately perpendicular to the first face 15a and the second face of the semiconductor layer 15. The insulating film 25, for example, has four side surfaces of a rectangular shape, and one of the four side surfaces is the third face 25b.

A part of the side surface of the n-side metal pillar 24 is exposed from the insulating film 25 on the third face 25b. The exposed face serves as an n-side external terminal 24b for mounting the semiconductor light emitting device on the external mounting substrate.

In addition, as shown in FIG. 23A, a part of the side surface 21b of the p-side interconnection layer 21 is also exposed from the insulating film 25 on the third face 25b and serves as a p-side external terminal. Similarly, a part of the side surface 22b of the n-side interconnection layer 22 is also exposed from the insulating film 25 on the third face 25b and serves as an n-side external terminal.

Parts of the p-side metal pillar 23 other than the p-side external terminal 23b that is exposed on the third face 25b is covered with the insulating film 25. In addition, parts of the n-side metal pillar 24 other than the n-side external terminal 24b that is exposed on the third face 25b is covered with the insulating film 25.

In addition, parts of the p-side interconnection layer 21 other than the side surface 21b that is exposed on the third face 25b is covered with the insulating film 25. In addition, parts of the n-side interconnection layer 22 other than the side surface 22b that is exposed on the third face 25b is covered with the insulating film 25.

On the other hand, a lens 36 is provided between the first face 15a and a phosphor layer 30. The lens 36 focuses light emitted from the light emitting layer 13, and improves the light distribution. Alternatively, it may be possible not to provide the lens 36 on the first face 15a.

In the embodiment, it is also possible to apply the above-described ESD protection device. For example, the protrusions 21c and 22c shown in the first embodiment are provided on the sides of the p-side interconnection layer 21 and the n-side interconnection layer 22 opposite to each other, so that a pathway of the surge current can be provided therebetween. It is also possible to build in a Schottky diode, for example.

The semiconductor light emitting device 4, as shown in FIG. 23, is mounted in a posture in which the third face 25b faces the mounting face 201 of the mounting substrate 200. The p-side external terminal 23b and the n-side external terminal 24b that are exposed on the third face 25b are bonded to the pad 202 that is formed on the mounting face 201 through soldering 203. In addition, an interconnection pattern is formed on the mounting face 201 of the mounting substrate 200, and the pad 202 is connected to the interconnection pattern.

The third face 25b is approximately perpendicular to the first face 15a that is the major light emitting face. Accordingly, in the posture in which the third face 25b is disposed toward the lower side, i.e. facing the mounting face 201 side, the first face 15a faces in the horizontal direction, not the upper side of the mounting face 201. That is, the semiconductor light emitting device 3 is a so-called side view type device in which light is emitted in the horizontal direction in a case where the mounting face 201 is set as the horizontal plane.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
    a first semiconductor layer having a first face, a second face opposite to the first face, and including a luminous portion and a non-luminous portion;
    a first electrode on the luminous portion of the first semiconductor layer;
    a second electrode on the non-luminous portion of the first semiconductor layer;
    a second semiconductor layer provided side by side with the first semiconductor layer;
    a third electrode on the second semiconductor layer;
    a fourth electrode on the second semiconductor layer, the fourth electrode being provided side by side with the third electrode;
    a first insulating film covering the first semiconductor layer, the first electrode, the second electrode, the second semiconductor layer, the third electrode, and the fourth electrode;
    a first interconnection on the first insulating film, the first interconnection being electrically connected to the first electrode and the third electrode;
    a second interconnection on the first insulating film, the second interconnection being electrically connected to the second electrode and the fourth electrode;
    a first metal pillar on the first interconnection;
    a second metal pillar on the second interconnection; and
    a second insulating film around the first metal pillar and the second metal pillar, the second insulating film continuously covering the first semiconductor layer and the second semiconductor layer via the first insulating film, the first interconnection, and the second interconnection,
    wherein a current passing through the first semiconductor layer flows in a reverse direction of a current passing through the second semiconductor layer between the first interconnection and the second interconnection.

2. The device according to claim 1, wherein the first electrode is provided on the luminous portion on the second face side, and the second electrode is provided on the non-luminous portion on the second face side.

3. The device according to claim 1, wherein a Schottky diode is provided between the third electrode and the fourth electrode.

4. The device according to claim 1, wherein one of the third electrode and the fourth electrode is connected to the second semiconductor layer with a Schottky contact.

5. The device according to claim 1, wherein a pn-type diode is provided between the third electrode and the fourth electrode.

6. The device according to claim 1, wherein the third electrode is in contact with a portion of a first conductivity type in the second semiconductor layer, and the fourth electrode is in contact with a portion of a second conductivity type in the second semiconductor layer.

7. The device according to claim 1, further comprising a phosphor layer provided on the first face side with no substrate provided between the phosphor layer and each of the first semiconductor layer and the second semiconductor layer, the phosphor layer including a phosphor.

8. A semiconductor light emitting device comprising:
   a first semiconductor layer having a first face, a second face opposite to the first face, and including a luminous portion and a non-luminous portion;
   a first electrode of a first polarity on the luminous portion of the first semiconductor layer;
   a second electrode of a second polarity on the non-luminous portion of the first semiconductor layer;
   a second semiconductor layer provided side by side with the first semiconductor layer, and including a rectifying element;
   a third electrode of the second polarity on the second semiconductor layer, the third electrode being electrically connected to the rectifying element;
   a fourth electrode of the first polarity on the second semiconductor layer, the fourth electrode being provided side by side with the third electrode and being electrically connected to the rectifying element;
   a first insulating film covering the first semiconductor layer, the first electrode, the second electrode, the second semiconductor layer, the third electrode, and the fourth electrode;
   a first interconnection on the first insulating film, the first interconnection being electrically connected to the first electrode and the third electrode;
   a second interconnection on the first insulating film, the second interconnection being electrically connected to the second electrode and the fourth electrode;
   a first metal pillar on the first interconnection;
   a second metal pillar on the second interconnection; and
   a second insulating film provided around the first metal pillar and the second metal pillar, the second insulating film continuously covering the first semiconductor layer and the second semiconductor layer via the first insulating film, the first interconnection, and the second interconnection.

9. The device according to claim 8, wherein the first electrode is provided on the luminous portion on the second face side, and the second electrode is provided on the non-luminous portion on the second face side.

10. The device according to claim 8, wherein the rectifying element is a Schottky diode between the third electrode and the fourth electrode.

11. The device according to claim 8, wherein one of the third electrode and the fourth electrode is connected to the second semiconductor layer with a Schottky contact.

12. The device according to claim 8, wherein the rectifying element is a pn-type diode between the third electrode and the fourth electrode.

13. The device according to claim 8, wherein the third electrode is in contact with a portion of a first conductivity type in the second semiconductor layer, and the fourth electrode is in contact with a portion of a second conductivity type in the second semiconductor layer.

14. The device according to claim 8, further comprising a phosphor layer provided on the first face side with no substrate provided between the phosphor layer and each of the first semiconductor layer and the second semiconductor layer, the phosphor layer including a phosphor.

* * * * *